(12) United States Patent
Yagisawa

(10) Patent No.: US 7,446,633 B2
(45) Date of Patent: Nov. 4, 2008

(54) INDUCTOR CIRCUIT BOARD, METHOD OF FORMING INDUCTOR, AND BIAS-T CIRCUIT

(75) Inventor: Takatoshi Yagisawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 135 days.

(21) Appl. No.: 11/654,017

(22) Filed: Jan. 17, 2007

(65) Prior Publication Data

US 2008/0042785 A1 Feb. 21, 2008

(30) Foreign Application Priority Data

Aug. 16, 2006 (JP) ............................. 2006-222069

(51) Int. Cl.
H01P 3/08 (2006.01)
(52) U.S. Cl. ................... 333/246; 333/245; 333/185
(58) Field of Classification Search .................. None
See application file for complete search history.

(56) References Cited

U.S. PATENT DOCUMENTS

2007/0085648 A1* 4/2007 Lee et al. .................... 336/200
2007/0164843 A1* 7/2007 Yagisawa et al. .............. 336/83
2007/0236319 A1* 10/2007 Hsu et al. .................... 336/200

OTHER PUBLICATIONS

Partial English Translation of JP 2004-193886 A (2 pp).

* cited by examiner

*Primary Examiner*—Anh Q Tran
(74) *Attorney, Agent, or Firm*—Staas & Halsey LLP

(57) ABSTRACT

An inductor circuit board that is made compatible with broadband by reducing parasitic capacitance of an inductor. The inductor circuit board is comprised of a flexible substrate made of a material, such as polyimide or liquid polymer, a transmission line formed on the flexible substrate, and an inductor. The inductor has a three-dimensional conical structure in which component inductors having different inductances are continuously connected to each other, with one end thereof connected to a portion of the transmission line between an input end and an output end thereof, and is formed according to a transmission line pattern by wiring on a plurality of surface layers of the flexible substrate and connecting portions wired on the surface layers by vias that connect between the layer surfaces of the substrate, such that the inductor is expanded in a fan-like manner as it is farther from the one end connected to the transmission line. A portion of the indictor closer to the transmission line has a smaller inductance, and a portion of the same farther from the transmission line has a larger inductance.

14 Claims, 23 Drawing Sheets

US 7,446,633 B2

INDUCTOR CIRCUIT BOARD, METHOD OF FORMING INDUCTOR, AND BIAS-T CIRCUIT

CROSS-REFERENCE TO RELATED APPLICATIONS

This application is based upon and claims the benefits of priority from the prior Japanese Patent Application No. 2006-222069 filed on Aug. 16, 2006, the entire contents of which are incorporated herein by reference.

BACKGROUND OF THE INVENTION

1. Field of the Invention

This invention relates to an inductor circuit board, a method of forming an inductor, and a bias-T circuit, and more particularly to an inductor circuit board having an inductor wired on a circuit board for a high-frequency transmission application, such as 40 Gb/s, a method of forming an inductor on a circuit board for a high-frequency transmission application, and a bias-T circuit that supplies a high-frequency signal by superposing a DC component thereon.

2. Description of the Related Art

Recently, with the development of multi-media technology, there is an increasing demand for constructing optical communication networks that transmit high-speed, large-volume information at low costs over long distances. To meet the demand, there have been developed optical communication systems whose transmission rate is in the order of 10 Gb/s, and further, for even higher-speed, larger-volume communications, optical communication systems whose transmission rate is in the order of 40 Gb/s are under development.

In the meanwhile, an electronic circuit called a bias-T is used in optical transmitter-receivers, measurement equipment, and so forth. The bias-T is comprised of an inductor (coil) and a capacitor, and supplies a high-frequency signal by superposing a DC component, e.g. a DC current or a DC voltage, on the high-frequency signal, without adversely affecting the high-frequency signal.

In the bias-T for use in optical communication at a transmission rate of 10 Gb/s or less ($\leq$10 Gb/s), it is possible to use a small-sized surface-mount inductor (surface-mount type having a size of approximately 1.0 mm×0.5 mm) as a component of the bias-T. Insofar as the bias-T is for applications at a transmission rate of 10 Gb/s or less, there occurs no marked degradation in high-frequency characteristics even with the use of such an inductor.

However, in performing optical communication at a transmission rate in the order of 40 Gb/s, a broad band ranging from several hundreds of KHz to 40 GHz is used. This makes it impossible to directly use such a surface-mount inductor as described above in the transmission line, and it is necessary to make the inductor compatible with broadband.

"To make the inductor compatible with broadband" specifically means to expand a blocking band of the inductor to a high-frequency band so as to prevent a high-frequency signal from being spoiled in high-frequency characteristics due to flow of the high-frequency signal into the inductor when the signal is passed through the transmission line connected to the inductor.

In general, in making the inductor compatible with broadband, it is ideal to connect component inductors having different inductances in series. However, actually, it is impossible to use an inductor formed simply by connecting the component inductors in series (hereinafter referred to as "the series inductor") since the characteristics thereof are degraded e.g. due to occurrence of a parasitic capacitance of the inductor. Hereinafter, the problems of the series inductor will be discussed.

FIG. 15 is a diagram showing the series inductor. The series inductor L10 is formed by connecting component inductors L11 to L13 having different inductances in series. Now, it is assumed that when the values of the inductances of the respective component inductors L11 to L13 are represented by L11a, L12a, and L13a, the values or magnitudes of the inductances satisfy the relationship of L11a<L12a<L13a.

FIG. 16 is a diagram showing a circuit configuration in which the series inductor L10 is connected to a transmission line. A measurement circuit 50 is formed by connecting the series inductor L10 to the transmission line 5 having an impedance of 50Ω through which a high-frequency signal flows. Further, it is assumed that the high-frequency signal is passed from a port p1 toward a port p2.

FIG. 17 is a diagram showing the frequency characteristics of the component inductors. In this figure, the vertical axis represents dB, and the horizontal axis represents the frequency. The individual frequency characteristics of the respective component inductors L11 to L13 forming the series inductor L10 are collectively shown.

The self-resonance frequency of the component inductor L13 having the largest inductance is represented by fr3, the self-resonance frequency of the component inductor L12 having a medium inductance by fr2, and the self-resonance frequency of the component inductor L11 having the smallest inductance by fr1 (as shown in FIG. 17, as the inductance is smaller, the self-resonance frequency becomes larger).

Here, a conceptual description will be given of an ideal signal flow to be obtained when a high-frequency signal is passed from the port p1 to the port p2 of the measurement circuit 50. Since a frequency signal, which is included in a frequency range A between frequencies a1 and a2 with the self-resonance frequency fr1 in its center, is blocked by the component inductor L11 (signal within the frequency range A is inhibited from flowing through the component inductor L11), the frequency signal flows from a port p3 in the X direction without flowing in the direction of the series inductor L10 (Y direction).

Further, in this case, if the component inductor L11 alone is connected to the transmission line 5, a frequency signal having frequencies smaller than the frequency a1 flows toward the component inductor L11. However, since the component inductor L12 is provided at the next-stage, a frequency signal, which is included in a frequency range B between frequencies b1 and b2 with the self-resonance frequency fr2 in its center, is blocked by the component inductor L12 (signal within the frequency range B is inhibited from flowing through the component inductor L12). As a consequence, a frequency signal in a frequency range between the frequencies b1 to a1 also flows in the X direction without flowing in the Y direction.

Similarly, since the component inductor L13 is connected, a frequency signal, which is included in a frequency range C between frequencies c1 and c2 with the self-resonance frequency fr3 in its center, is blocked by the component inductor L13 (signal within the frequency range C is inhibited from flowing through the component inductor L13). As a consequence, a frequency signal in a frequency range between the frequencies c1 to a2 flows in the X direction without flowing in the Y direction.

As described above, by forming the series inductor by connecting component inductors having different inductances in series, blocking bands of the respective component inductors are arranged in an overlapping manner such that no passbands of the inductors appear at any intermediate portions of the entire frequency range. Therefore, ideally, it is possible to make the inductor compatible with broadband.

FIG. 18 is a diagram showing ideal frequency characteristics of the measurement circuit 50. The vertical axis represents dB, and the horizontal axis represents the frequency. In this figure, F1 indicates the ideal frequency characteristics (dotted line) of a signal flowing in the X direction from the port p1 to the port p2 of the transmission line 5, and F2 indicates the ideal frequency characteristics (solid line) of the series inductor L10.

In the ideal frequency characteristics shown in FIG. 18, since the characteristics of a broadband signal within the frequency range between the frequencies c1 and a2 are flat, it is understood that the signal flows through the transmission line 5 in the X direction without being degraded in its characteristics.

However, the above state is an ideal one, and in the actual high-frequency circuit, parasitic capacitances of the component inductors themselves and earth capacitances cannot be ignored. This makes it impossible for a mere series inductor to be compatible with broadband.

FIG. 19 is a diagram showing an equivalent circuit of an inductor. The inductor 100 (corresponding to one component inductor of the series inductor L10) not only has an inductance inherent thereto but also includes a capacitor (parasitic capacitance or line capacitance) formed by wound electric wires, a winding resistance, and so forth.

The equivalent circuit 100a of the inductor 100 can be defined as a circuit in which an inductor L0 and a resistance R0 are connected in series, and a part formed by series connection of the inductor L0 and the resistance R0 and a capacitor Cr are connected in parallel. Further, when lead wires of the inductor 100 are mounted on a printed circuit board, earth capacitances appear at respective locations of pads (copper foils for soldering, for use in mounting the component on the printed circuit board), and therefore the equivalent circuit 100a looks as if it has capacitors C1 and C2 connected between the lead wires and ground GND.

The parasitic capacitance of the capacitor Cr has a very small value, and hence it raises no problem when the inductor 100 is used with low frequencies. However, when the inductor 100 is used as a high-frequency circuit, the parasitic capacitance is not negligible, but causes variations in the impedance of the inductor and the self-resonance frequency.

FIG. 20 is a diagram showing actual frequency characteristics of the measurement circuit 50. The vertical axis represents dB, and the horizontal axis represents the frequency. In this figure, F1a indicates the actual frequency characteristics (dotted line) of a signal flowing in the X direction from the port p1 to the port p2 of the transmission line 5, and F2a indicates the actual frequency characteristics (solid line) of the series inductor L10.

In the actual frequency characteristics shown in FIG. 20, instantaneous passbands in the Y direction appear at the frequencies f1 and f2 within the frequency range between the frequencies c1 and a2, which generate two dips in the frequency characteristics F1a. More specifically, a signal flowing through the transmission line 5 in the X direction flows in the Y direction as well from the port p3 into the series inductor L10 at the frequencies f1 and f2, which degrades the frequency characteristics. As described above, the simple series inductor formed by connecting component inductors having different inductances in series has not been applicable to high-speed optical communications at transmission rates in the order of 40 Gb/s or more.

Conventionally, a technique for forming a bias-T by using a conical coil has been proposed as the prior art of high-frequency circuits, e.g. in Japanese Laid-Open Patent Publication (Kokai) No. 2004-193886 (Paragraph numbers [0014] to [0019], and FIG. 1).

As the prior art of making inductors compatible with broadband, the use of an inductor called a conical coil which has a high self-resonance frequency is becoming popular.

FIG. 21 is a diagram showing the outline of the conical coil. The conical coil 110 is a conductor having a conical shape, which is formed by winding a conductor wire 111 covered with an insulating film, around an outer peripheral surface of a frustoconical core 112 made of a magnetic material, such that the winding diameter of the conductor wire progressively decreases from one end to the other end of the coil (from the right end to the left end, as viewed in FIG. 21). Further, the opposite ends of the conductor wire 111 have the insulating film peeled off to expose copper wire 111a, for use as terminals.

FIG. 22 is a diagram showing an equivalent circuit of the conical coil 110. The equivalent circuit 110a of the conical coil 110 is comprised of component inductors L1 to Ln which have different inductances and are connected in series. In this case, the component inductors L1 to Ln of the conical coil 110 are sequentially arranged in series in the increasing order of inductance, as viewed from the tip side of the frustoconical shape.

Compared with the above-described series inductor, the conical coil 110 configured as above is characterized in that it can secure broadband characteristics of approximately several hundreds of KHz to several tens of GHz, and since the tip thereof has a small diameter, the value of inductance thereof is small and the parasitic capacitance thereof is held small, whereby it is possible to maintain its characteristics up to a high frequency of several tens of GHz.

It should be noted that the conical coil 110 has its highest frequency characteristics determined by the component inductor L1, and the frequency characteristics in a higher to a lower frequency ranges are sequentially determined by the component inductor L1 to the component inductor Ln, respectively.

More specifically, the conical coil 110 is configured such that the high frequency characteristics are determined by the value of inductance of the component inductor L1, which is the first and smallest-diameter coil on the tip side of the conical coil 110 (the high frequency characteristics can be secured by the component inductor L1 since the component inductor L1 has a small diameter and hence has a small inductance value), and the frequency characteristics of the conical coil 110 from a higher to a lower frequency ranges are sequentially determined by the inductance values of the component inductors the diameter of which increases from the component inductor L1 to the component inductor Ln.

However, the conical coil 110 configured as above is difficult to mount on a circuit board, and is not easy to handle, either. FIG. 23 is a diagram showing how the conical coil 110 is bonded. The tip of the conical coil 110 is bonded (press-fitted) on a circuit board by heat or ultrasonic waves.

In general, the conical coil 110 is compact in size, i.e. approximately several mm long in the longitudinal direction. Further, the winding of the conical coil 110 is as thin as a small diameter of approximately several tens of μm, and has an unstable shape. Therefore, the conical coil 110 is generally mounted within an IC package. Further, it is necessary to connect the conical coil 110 by accurate bonding manually performed by a skilled worker. Therefore, the conical coil 110 can be used in limited areas or locations of devices, and is very difficult to handle.

Further, a lead wire is allowed to be extended from the tip of the conical coil 110 only by several hundreds of μm, and if it is further extended, the high frequency characteristics are degraded. Moreover, the characteristics of the conical coil 110 depend on the mounting angle thereof, and hence there is a problem that a large variation in the characteristics is caused when the conical coil 110 is mounted.

SUMMARY OF THE INVENTION

The present invention has been made in view of the above points, and an object thereof is to provide an inductor circuit board which is reduced in parasitic capacitance to make an inductor thereof compatible with broadband without using a conical coil having a conventional shape.

Another object of the present invention is to provide a method of forming an inductor, which is capable of reducing a parasitic capacitance to make the inductor compatible with broadband.

Further, still another object of the invention is to provide a bias-T circuit having an inductor the parasitic capacitance of which is reduced to make the inductor compatible with broadband.

To attain the above object, there is provided an inductor circuit board on which an inductor is wired. This inductor circuit board is comprised of a substrate, a transmission line that is formed on the substrate, and an inductor having a three-dimensional conical structure, the inductor having one end thereof connected to the transmission line and being formed according to a transmission line pattern by wiring on a plurality of layer surfaces of the substrate and connecting portions wired on the respective layer surfaces by vias that connect between the layer surfaces of the substrate, such that the inductor is expanded in a fan-like manner as the inductor extends farther from the one end connected to the transmission line.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
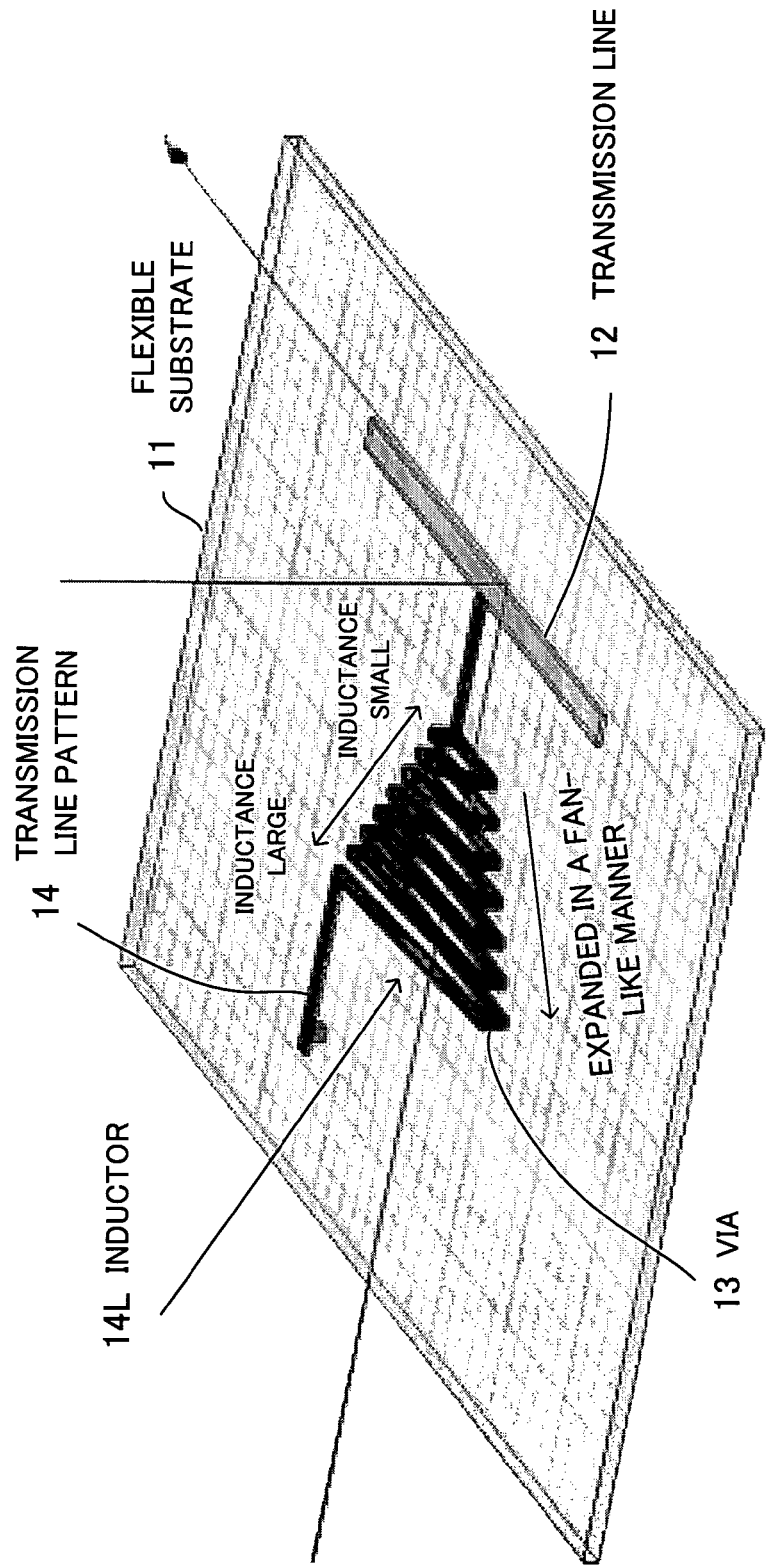
FIG. 1 is a diagram of an inductor circuit board.

The invention will now be described in detail with reference to the drawings showing a preferred embodiment thereof. FIG. 1 is a diagram of an inductor circuit board. The inductor circuit board 10 is a flexible printed circuit (FPC) and is comprised of a substrate (hereinafter referred to as "the flexible substrate") 11 formed of polyimide, liquid polymer or a like material, a transmission line 12 formed on the flexible substrate 11, and an inductor 14L formed according to a transmission line pattern 14.

It should be noted that flexible printed circuits (FPCs) are printed circuit boards having flexibility, and due to bendability thereof, they are widely used in various small-sized products, such as cellular phones, digital cameras, and so forth, which are limited in mounting space.

The inductor 14L formed according to the transmission line pattern 14 has a three-dimensional conical structure in which component inductors having different inductances are continuously connected to each other, with one end of the inductor 14L connected to a portion of the transmission line 12 between an input end and an output end thereof. The inductor 14L is formed by wiring on a plurality of layer surfaces of the flexible substrate 11 while connecting portions wired on the respective layer surfaces by vias (plated holes for connecting between layer surfaces of a multilayer printed circuit) 13 that connect between the layer surfaces, such that the inductor 14L is expanded in a fan-like manner as it is farther from the one end connected to the transmission line 12. The indictor 14L is configured such that as a component indictor thereof closer to the transmission line 12 has a smaller inductance and a component inductor thereof farther from the transmission line 12 has a larger inductance.

Figure 2:
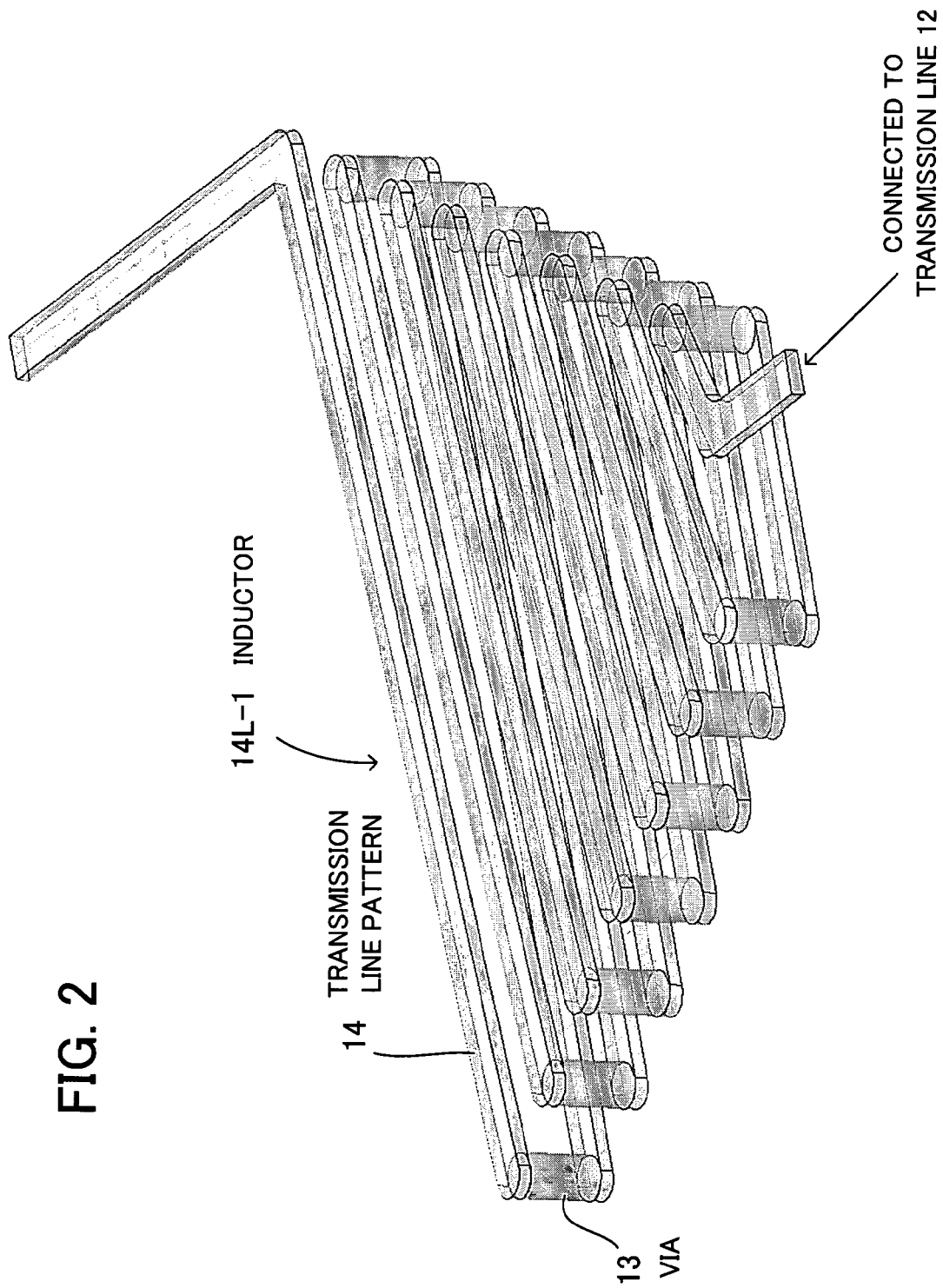
FIG. 2 is a diagram showing a structure in which an inductor is formed on a two-metal layer flexible substrate.

Next, a description will be given of a case where the inductor 14L is formed on a two-layer flexible substrate. FIG. 2 is a diagram showing a structure in which an inductor is formed on layer surfaces (upper and lower surfaces) of a two-metal layer flexible substrate, which illustrates an inductor 14L-1 having a three-dimensional conical structure, formed by the transmission line pattern 14.

The inductor 14L-1 having a three-dimensional conical structure is formed by wiring according to the transmission line pattern 14 on the respective layers (i.e. layer surfaces) of the two-layer flexible substrate (not shown) while connecting portions wired on the layer surfaces by the vias 13 such that the inductor 14L-1 is expanded in a fan-like manner as it is farther from the transmission line 12.

Figure 3:
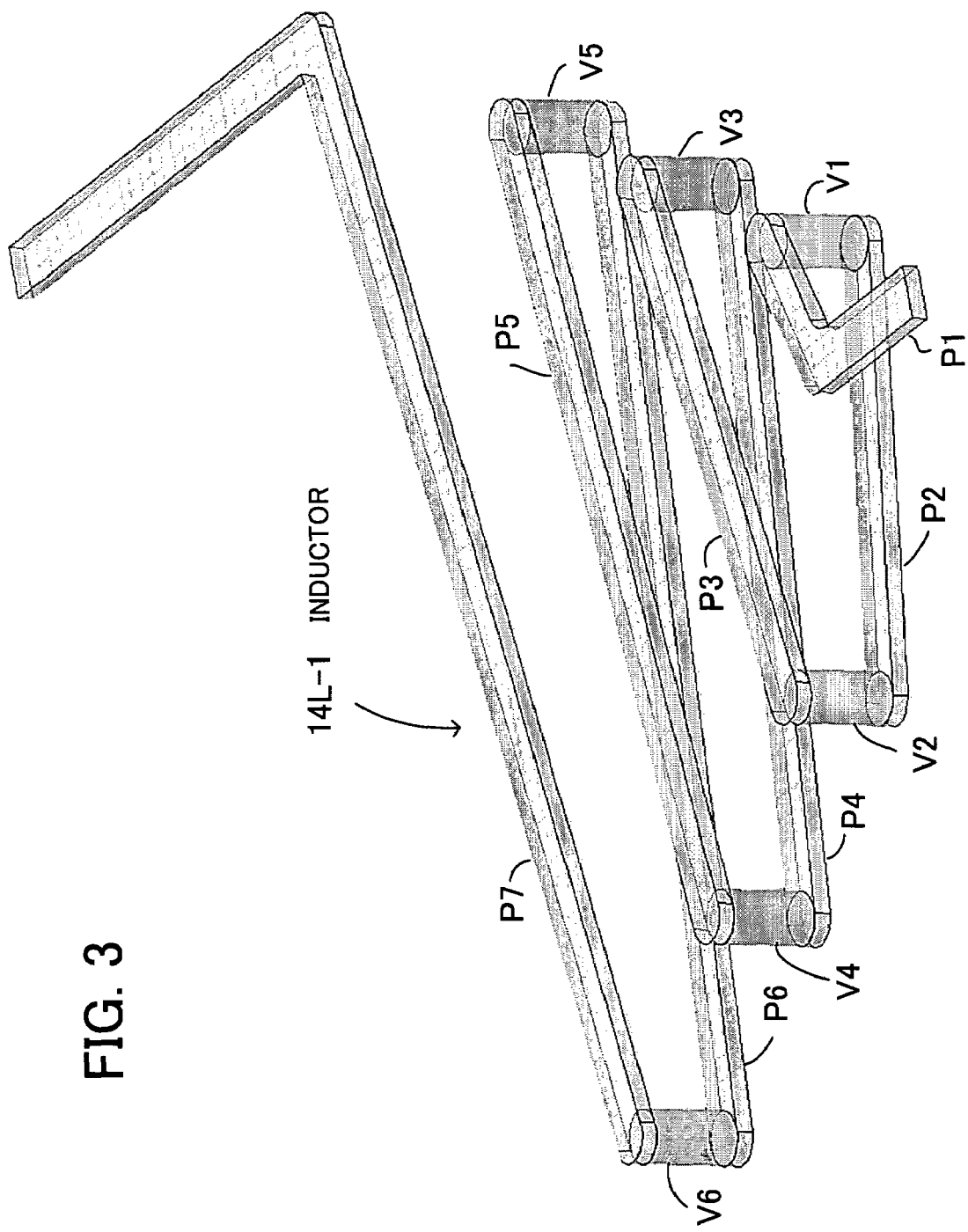
FIG. 3 is a diagram showing a wiring structure of the inductor in a simplified form.

FIG. 3 is a diagram showing a wiring structure of the inductor 14L-1 in a simplified form. Hereinafter, a forming process of the inductor 14L-1 formed on the two-layer flexible substrate will be described with reference to FIG. 3. Here, assuming that wiring is performed according to the transmission line pattern 14 on the two layer surfaces (the opposite surfaces of the substrate), in an alternating manner, starting from a first layer surface, portions wired according to the transmission line pattern 14 on the respective layer surfaces are represented by reference numerals P1, P2, . . . , and Pn, respectively, in the order of wiring, and vias connected to the opposite ends of each portion Pn (hereinafter referred to as "the transmission line pattern portion Pn") by V(n−1) and Vn, respectively.

In the case of n=1, a transmission line pattern portion P1 is formed on the first layer surface, with one end thereof connected to the transmission line 12 and the other end connected to a via V1 whereby it is connected to a transmission line pattern portion P2 on the second layer surface by the via V1.

Next, when attention is paid to transmission line pattern portions P3, P5, and P7 (except for the transmission line pattern portion P1) wired on the first layer surface, in the case of n=3, the transmission line pattern portion P3 is formed on the first layer surface with opposite ends thereof connected to vias V2 and V3, respectively, whereby it is connected to the transmission line pattern portion P2 on the second layer surface by the via V2 and is connected to a transmission line pattern portion P4 on the second layer surface by the via V3.

In the case of n=5, the transmission line pattern portion P5 is formed on the first layer surface, with opposite ends thereof connected to vias V4 and V5, respectively, whereby it is connected to the transmission line pattern portion P4 on the second layer surface by the via V4 and is connected to a transmission line pattern portion P6 on the second layer surface by the via V5.

When one end of the transmission line pattern portion P7 is connected to a signal source in the case of n=7, the transmission line pattern portion P7 is formed on the first layer surface with the one end thereof connected to the signal source and the other end thereof connected to a via V6 whereby it is connected to the transmission line pattern portion P6 on the second layer surface by the via V6.

A wiring structure of the transmission line pattern portion Pn wired on the first layer surface is generalized as follows: In the case of n=(2k−1) (k=2, 3, . . . ), a transmission line pattern portion P(2k−1) is formed on the first layer surface with opposite ends thereof connected to vias V(k−2) and V(2k−1), respectively, whereby the transmission line pattern portion P(2k−1) is connected to a transmission line pattern portion P(2k−2) on the second layer surface by the via V(2k−2) and is connected to a transmission line pattern portion P2k on the second layer surface by the via V(2k−1).

Further, in the case of n=(2k−1) (k=2, 3, . . . ), when one end of the transmission line pattern portion P(2k−1) is connected to the signal source, the transmission line pattern portion P(2k−1) is formed on the first layer surface with the one end thereof connected to the signal source and the other end thereof connected to the via V(2k−2) whereby the transmission line pattern portion P(2k−1) is connected to the transmission line pattern portion P(2k−2) on the second layer surface by the via V(2k−2).

Then, when attention is paid to the transmission line pattern portions P2, P4, and P6 wired on the second layer surface, in the case of n=2, the transmission line pattern portion P2 is formed on the second layer surface with opposite ends thereof connected to vias V1 and V2, respectively, whereby the transmission line pattern portion P2 is connected to the transmission line pattern portion P1 on the first layer surface by the via V1 and is connected to the transmission line pattern portion P3 on the first layer surface by the via V2.

In the case of n=4, the transmission line pattern portion P4 is formed on the second layer surface with opposite ends thereof connected to the vias V3 and V4, respectively, whereby the transmission line pattern portion P4 is connected to the transmission line pattern portion P3 on the first layer surface by the via V3 and is connected to the transmission line pattern portion P5 on the first layer surface by the via V4.

In the case of n=6, the transmission line pattern portion P6 is formed on the second layer surface with opposite ends thereof connected to the vias V5 and V6, respectively, whereby the transmission line pattern portion P6 is connected to the transmission line pattern portion P5 on the first layer surface by the via V5 and is connected to the transmission line pattern portion P7 on the first layer surface by the via V6.

A wiring structure of the transmission line pattern portion Pn wired on the second layer surface is generalized as follows: In the case of n=2k (k=1, 2, . . . ), a transmission line pattern portion P2k is formed on the second layer surface with opposite ends thereof connected to vias V(2k−1) and V2k, respectively, whereby the transmission line pattern portion P2k is connected to the transmission line pattern portion P(2k−1) on the first layer surface by the via V(2k−1) and is connected to a transmission line pattern portion P(2k+1) on the first layer surface by the via V2k.

Figure 4:
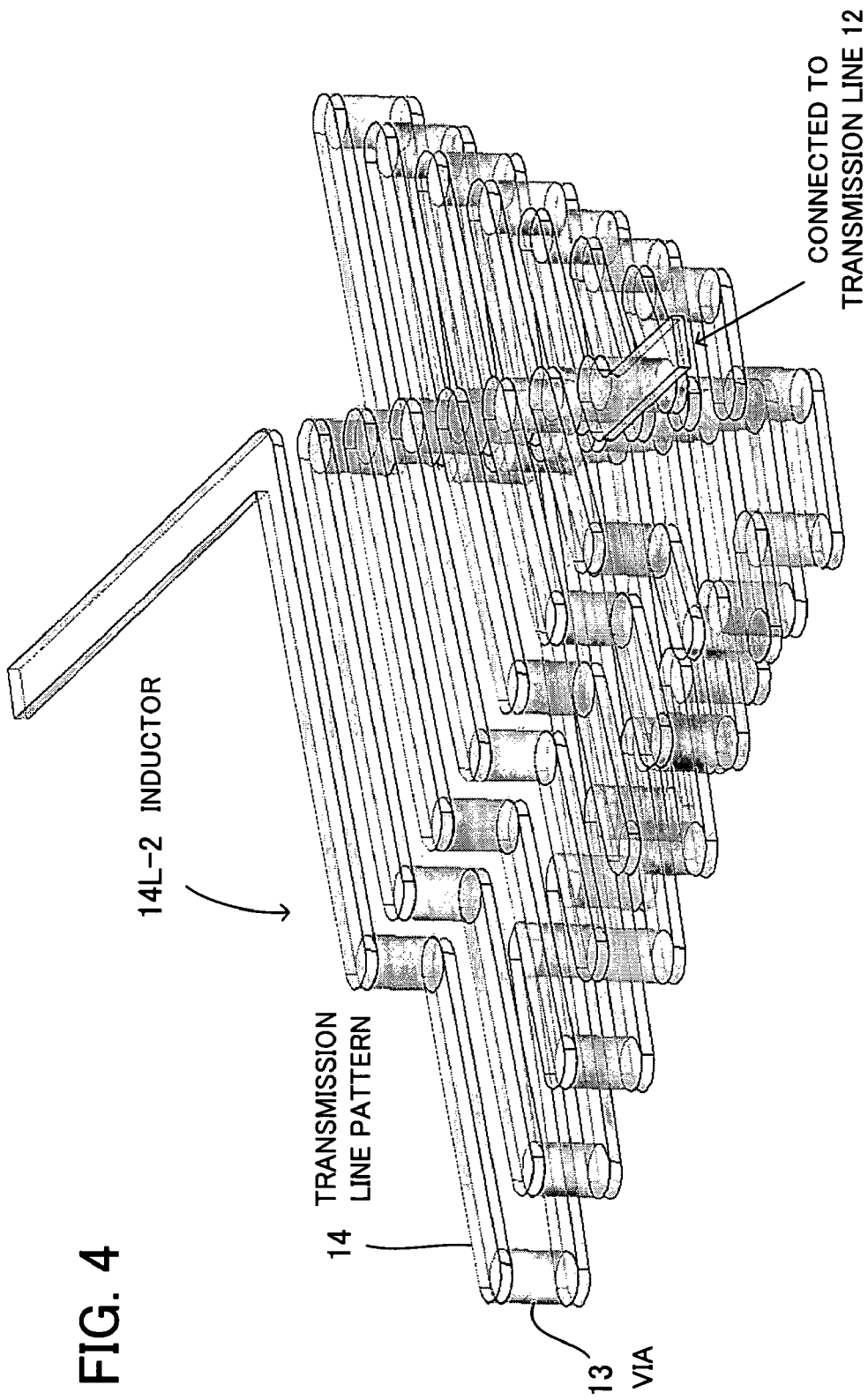
FIG. 4 is a diagram showing a structure in which an inductor is formed on a four-metal layer flexible substrate.

Next, a description will be given of a case in which the inductor 14L is formed on a four-layer flexible substrate 11. FIG. 4 is a diagram showing a structure in which the inductor is formed on layer surfaces of a four-metal layer flexible substrate, which illustrates an inductor 14L-2 having a three-dimensional conical structure, formed by the transmission line pattern 14.

The inductor 14L-2 having a three-dimensional conical structure is formed by wiring according to the transmission line pattern 14 on the layers of the four-layer flexible substrate (not shown) while connecting transmission line pattern portions on respective layer surfaces by vias 13 such that the inductor 14L-2 is expanded in a fan-like manner as it is farther from the transmission line 12.

Figure 5:
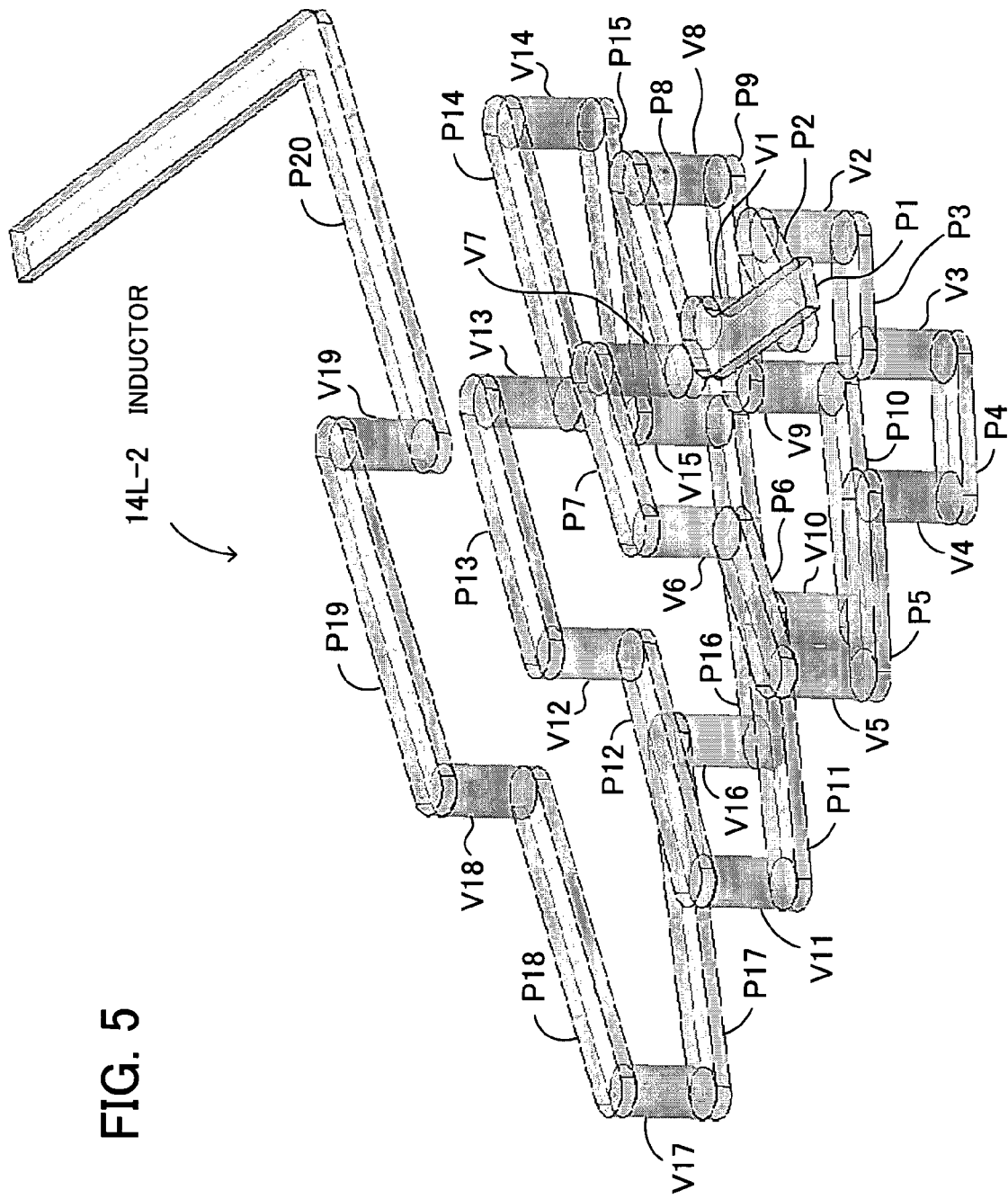
FIG. 5 is a diagram of a wiring structure of the inductor in a simplified form.

FIG. 5 is a diagram of a wiring structure of the inductor 14L-2 in a simplified form. Hereinafter, a wiring process of the inductor 14L-2 for the four-layer substrate will be described with reference to FIG. 5. Here, assuming that wiring is performed according to the transmission line pattern 14 on the four respective layer surfaces, sequentially, starting from a first layer surface, portions wired according to the transmission line pattern 14 on the respective layer surfaces are represented by reference numerals P1, P2, . . . , and Pn, respectively, in the order of wiring, and vias connected to the opposite ends of each portion Pn by V(n−1) and Vn, respectively.

In the case of n=1, a transmission line pattern portion P1 is formed on the first layer surface with one end thereof connected to the transmission line 12 and the other end thereof connected to a via V1 whereby it is connected to a transmission line pattern portion P2 on a second layer by the via V1.

Next, when attention is paid to transmission line pattern portions P6, P12, and P18 wired on the left side of the second layer, in the case of n=6, the transmission line pattern portion P6 is formed on the second layer surface with opposite ends thereof connected to vias V5 and V6, respectively, whereby it is connected to a transmission line pattern portion P5 on a third layer by the via V5 and is connected to a transmission line pattern portion P7 on the first layer surface by the via V6.

In the case of n=12, the transmission line pattern portion P12 is formed on the second layer surface with opposite ends thereof connected to vias V11 and V12, respectively, whereby it is connected to a transmission line pattern portion P11 on the third layer surface by the via V11 and is connected to a transmission line pattern portion P13 on the first layer surface by the via V12.

In the case of n=18, the transmission line pattern portion P18 is formed on the second layer surface with opposite ends thereof connected to vias V17 and V18, respectively, whereby it is connected to a transmission line pattern portion P17 on the third layer surface by the via V17 and is connected to a transmission line pattern portion P19 on the first layer surface by the via V18.

A wiring structure of the transmission line pattern portion Pn wired on the left side of the second layer is generalized as follows: In the case of n=6k (k=1, 2, . . . ), a transmission line pattern portion P6k is formed on the second layer surface with opposite ends thereof connected to vias V(6k−1) and V6k, respectively, whereby it is connected to a transmission line pattern portion P(6k−1) on the third layer surface by the via V(6k−1) and is connected to a transmission line pattern portion P(6k+1) on the first layer surface by the via V6k.

Next, when attention is paid to the transmission line pattern portions P5, P11, and P17 wired on the left side of the third layer, in the case of n=5, the transmission line pattern portion P5 is formed on the third layer surface with opposite ends thereof connected to a via V4 and the via V5, respectively, whereby it is connected to a transmission line pattern portion P4 on a fourth layer by the via V4 and is connected to the transmission line pattern portion P6 on the second layer surface by the via V5.

In the case of n=11, the transmission line pattern portion P11 is formed on the third layer surface with opposite ends thereof connected to a via V10 and the via V11, respectively, whereby it is connected to a transmission line pattern portion P10 on the fourth layer surface by the via V10 and is connected to a transmission line pattern portion P12 on the second layer surface by the via V11.

In the case of n=17, the transmission line pattern portion P17 is formed on the third layer surface with opposite ends thereof connected to a via V16 and the via V17, respectively, whereby it is connected to a transmission line pattern portion P16 on the fourth layer surface by the via V16 and is connected to the transmission line pattern portion P18 on the second layer surface by the via V17.

A wiring structure of the transmission line pattern portion Pn wired on the left side of the third layer is generalized as follows: In the case of n=6k−1 (k=1, 2, . . . ), the transmission line pattern portion P(6k−1) is formed on the third layer surface with opposite ends thereof connected to a via V(6k−2) and the via V(6k−1), respectively, whereby it is connected to a transmission line pattern portion P(6k−2) on the fourth layer surface by the via V(6k−2) and is connected to the transmission line pattern portion P6k on the second layer surface by the via V(6k−1).

Next, when attention is paid to the transmission line pattern portions P4, P10, and P16 wired on the fourth layer surface, in the case of n=4, the transmission line pattern portion P4 is formed on the fourth layer surface with opposite ends thereof connected to a via V3 and the via V4, respectively, whereby it is connected to a transmission line pattern portion P3 on the third layer surface by the via V3 and is connected to the transmission line pattern portion P5 on the third layer surface by the via V4.

In the case of n=10, the transmission line pattern portion P10 is formed on the fourth layer surface with opposite ends thereof connected to a via V9 and the via V10, respectively, whereby it is connected to a transmission line pattern portion P9 on the third layer surface by the via V9 and is connected to the transmission line pattern portion P11 on the third layer surface by the via V10.

In the case of n=16, the transmission line pattern portion P16 is formed on the fourth layer surface with opposite ends thereof connected to a via V15 and the via V16, respectively, whereby it is connected to a transmission line pattern portion P15 on the third layer surface by the via V15 and is connected to the transmission line pattern portion P17 on the third layer surface by the via V16.

A wiring structure of the transmission line pattern portion Pn wired on the fourth layer surface is generalized as follows: In the case of n=6k−2 (k=1, 2, . . . ), the transmission line pattern portion P(6k−2) is formed on the fourth layer surface with opposite ends thereof connected to a via V(6k−3) and the via V(6k−2), respectively, whereby it is connected to a transmission line pattern portion P(6k−3) on the third layer surface by the via V(6k−3) and is connected to the transmission line pattern portion P(6k−1) on the third layer surface by the via V(6k−2).

Next, when attention is paid to the transmission line pattern portions P3, P9, and P15 wired on the right side of the third layer, in the case of n=3, the transmission line pattern portion P3 is formed on the third layer surface with opposite ends thereof connected to a via V2 and the via V3, respectively, whereby it is connected to the transmission line pattern portion P2 on the second layer surface by the via V2 and is connected to the transmission line pattern portion P4 on the fourth layer surface by the via V3.

In the case of n=9, the transmission line pattern portion P9 is formed on the third layer surface with opposite ends thereof connected to a via V8 and the via V9, respectively, whereby it is connected to a transmission line pattern portion P8 on the second layer surface by the via V8 and is connected to the transmission line pattern portion P10 on the fourth layer surface by the via V9.

In the case of n=15, the transmission line pattern portion P15 is formed on the third layer surface with opposite ends thereof connected to a via V14 and the via V15, respectively, whereby it is connected to a transmission line pattern portion P14 on the second layer surface by the via V14 and is connected to the transmission line pattern portion P16 on the fourth layer surface by the via V15.

A wiring structure of the transmission line pattern portion Pn wired on the right side of the third layer is generalized as follows: In the case of n=6k−3 (k=1, 2, . . . ), the transmission line pattern portion P(6k−3) is formed on the third layer surface with opposite ends thereof connected to a via V(6k−4) and the via V(6k−3), respectively, whereby it is connected to a transmission line pattern portion P(6k−4) on the second layer surface by the via V(6k−4) and is connected to the transmission line pattern portion P(6k−2) on the fourth layer surface by the via V(6k−3).

Next, when attention is paid to the transmission line pattern portions P2, P8, and P14 wired on the right side of the second layer, in the case of n=2, the transmission line pattern portion P2 is formed on the second layer with opposite ends thereof connected to the via V1 and the via V2, respectively, whereby it is connected to the transmission line pattern portion P1 on the first layer surface by the via V1 and is connected to the transmission line pattern portion P3 on the third layer surface by the via V2.

In the case of n=8, the transmission line pattern portion P8 is formed on the second layer surface with opposite ends thereof connected to a via V7 and the via V8, respectively, whereby it is connected to the transmission line pattern portion P7 on the first layer surface by the via V7 and is connected to the transmission line pattern portion P9 on the third layer surface by the via V8.

In the case of n=14, the transmission line pattern portion P14 is formed on the second layer surface with opposite ends thereof connected to a via V13 and the via V14, respectively, whereby it is connected to the transmission line pattern portion P13 on the first layer surface by the via V13 and is connected to the transmission line pattern portion P15 on the third layer surface by the via V14.

A wiring structure of the transmission line pattern portion Pn wired on the right side of the second layer is generalized as follows: In the case of n=6k–4 (k=1, 2, . . . ), the transmission line pattern portion P(6k–4) is formed on the second layer surface with opposite ends thereof connected to a via V(6k–5) and the via V(6k–4), respectively, whereby it is connected to a transmission line pattern portion P(6k–5) on the first layer surface by the via V(6k–5) and is connected to the transmission line pattern portion P(6k–3) on the third layer surface by the via V(6k–4).

Next, when attention is paid to the transmission line pattern portions P7, P13, and P19 (except for the transmission line pattern portion P1) wired on the first layer surface, in a case of n=7, the transmission line pattern portion P7 is formed on the first layer surface with opposite ends thereof connected to the via V6 and the via V7, respectively, whereby it is connected to the transmission line pattern portion P6 on the second layer surface by the via V6 and is connected to the transmission line pattern portion P8 on the second layer surface by the via V7.

In the case of n=13, the transmission line pattern portion P13 is formed on the first layer surface with opposite ends thereof connected to the via V12 and the via V13, respectively, whereby it is connected to the transmission line pattern portion P12 on the second layer surface by the via V12 and is connected to the transmission line pattern portion P14 on the second layer surface by the via V13.

In the case of n=19, the transmission line pattern portion P19 is formed on the first layer surface with opposite ends thereof connected to the via V18 and a via V19, respectively, whereby it is connected to the transmission line pattern portion P18 on the second layer surface by the via V18 and is connected to a transmission line pattern portion P20 on the second layer surface by the via V19.

A wiring structure of the transmission line pattern portion Pn wired on the first layer surface is generalized as follows: In the case of n=6k–5 (k=2, 3, . . . ), the transmission line pattern portion P(6k–5) is formed on the first layer surface with opposite ends thereof connected to a via V(6k–6) and the via V(6k–5), respectively, whereby it is connected to a transmission line pattern portion P(6k–6) on the second layer surface by the via V(6k–6) and is connected to the transmission line pattern portion P(6k–4) on the second layer surface by the via V(6k–5).

It should be noted that although in FIG. 5, one end of the transmission line pattern portion P19 is connected to the transmission line pattern portion P20 by the via V19 and the transmission line pattern portion P20 is connected to the signal source, if one end of the transmission line pattern portion P19 is to be connected to the signal source, the transmission line pattern portion P19 is configured such that it is formed on the first layer surface with the one end thereof connected to the signal source and the other end thereof connected to the via V18 whereby it is connected to the transmission line pattern portion P18 on the second layer surface by the via V18.

This wiring structure is generalized as follows: In the case of n=6k–5 (k=2, 3, . . . ), if one end of the transmission line pattern portion P(6k–5) is connected to the signal source, the transmission line pattern portion P(6k–5) is formed on the first layer surface with the one end thereof connected to the signal source and the other end thereof connected to the via V(6k–6), whereby it is connected to the transmission line pattern portion P(6k–6) on the second layer surface by the via V(6k–6).

Figure 6:
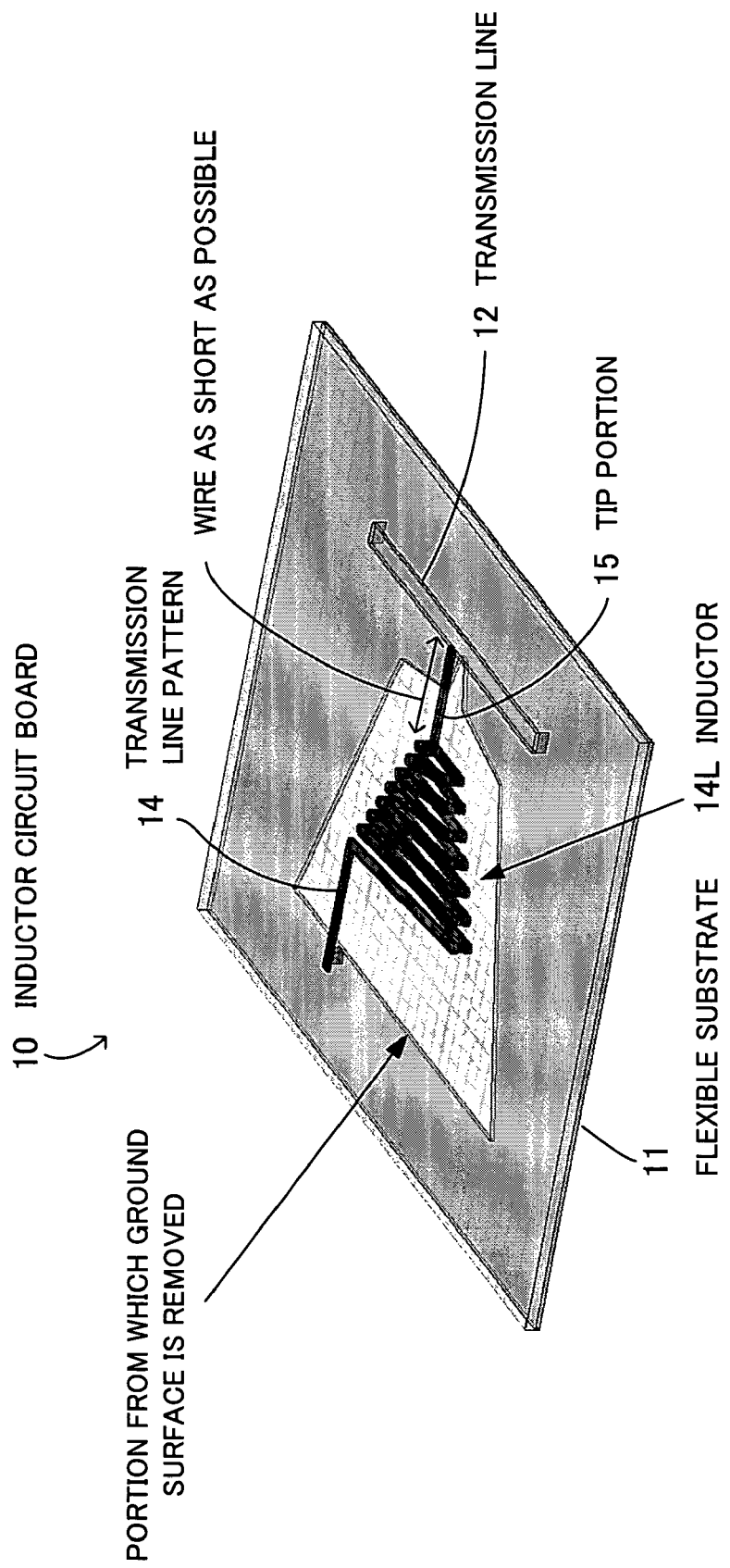
FIG. 6 is a diagram illustrating features of a structure of the inductor circuit board.

Next, a description will be given of features of the structure of the inductor circuit board 10. FIG. 6 is a diagram illustrating features of the structure of the inductor circuit board 10. When the inductor 14L is formed, wire is performed on the layers of the flexible substrate 11 according to the transmission line pattern 14, and hence a ground surface of the flexible substrate 11 is removed, which is formed on a side reverse to a mounting surface of the same where the inductor 14L is mounted.

Further, to minimize adverse influence on the ground of the transmission line 12, the ground surface of the flexible substrate 11 is also removed which is located on a side reverse to a surface of the flexible substrate 11 where there is formed the tip portion 15 of the inductor 14L, which is connected to the transmission line 12.

Further, since the line of the tip portion 15 of the inductor 14L, which is connected to the transmission line 12, is an easiest portion of a stab (portion where wiring is branched) to be seen, the tip portion 15 is connected to the transmission line 12 such that it is as short as possible within a range of length which does not adversely affect the transmission line 12 (e.g. 0.1 mm to several mm).

Figure 7:
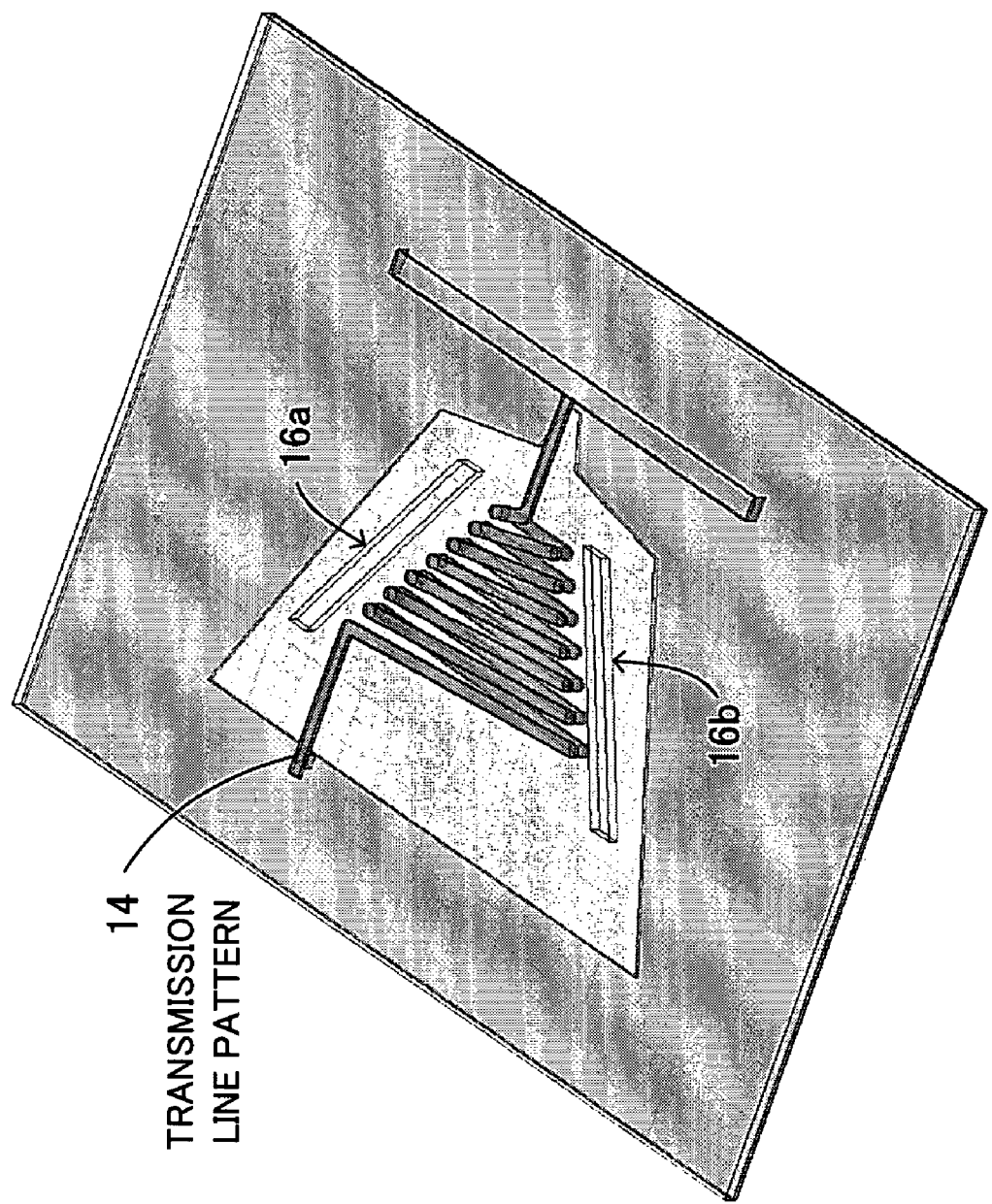
FIG. 7 is a diagram illustrating features of a structure of a variation of the inductor circuit board.

FIG. 7 is a diagram showing features of the structure of a variation of the inductor circuit board 10. FIG. 7 illustrates a state of the inductor circuit board 10 in which the material of the flexible substrate 11 surrounding the transmission line pattern portion 14 is removed to provide spaces 16a and 16b in the surrounding portion. This contributes to further reduction of the parasitic capacitance of the inductor 14L.

Figure 8:
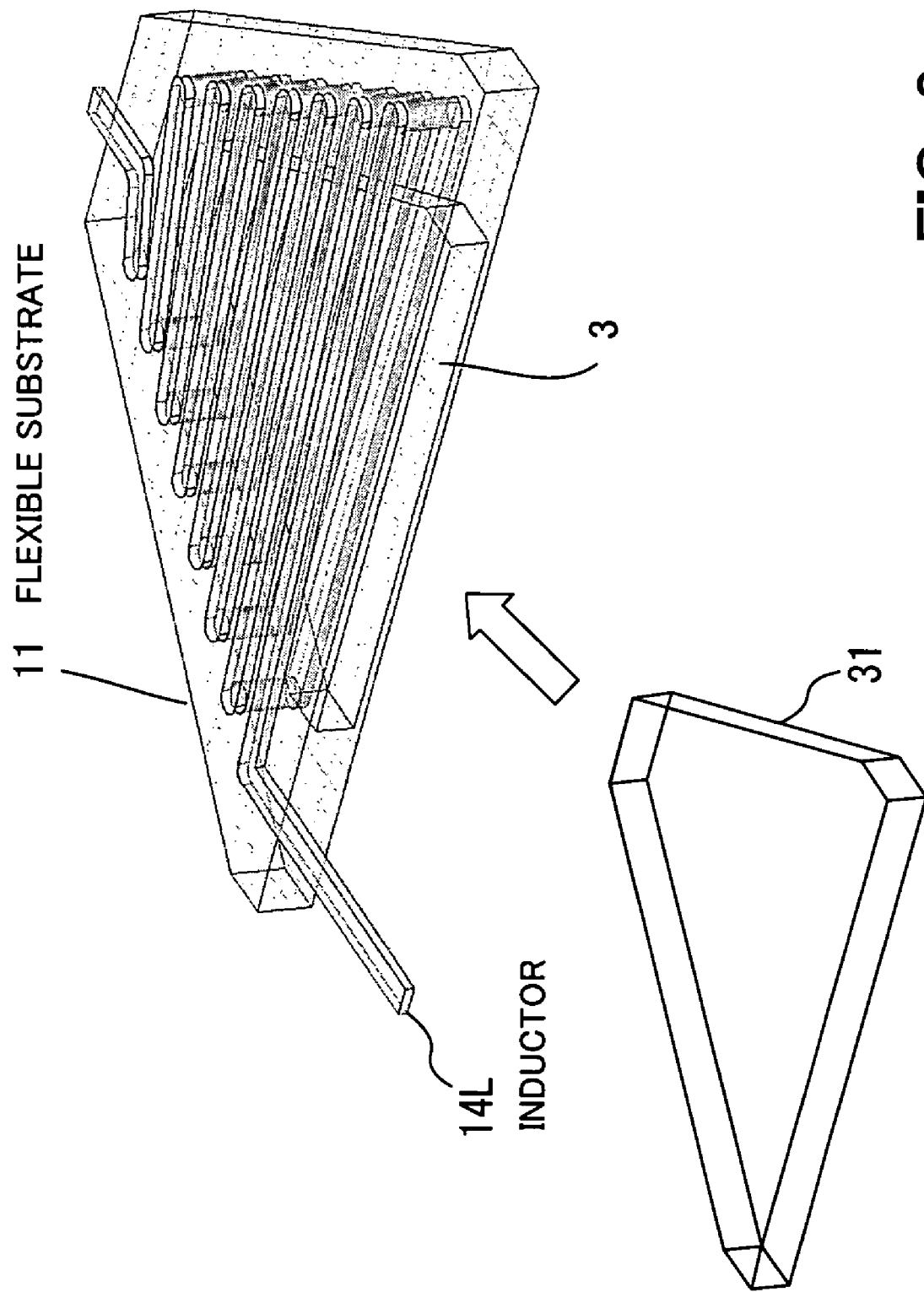
FIG. 8 is a diagram illustrating features of a structure of another variation of the inductor circuit board.

FIG. 8 is a diagram showing futures of the structure of another variation of the inductor circuit board 10. In this figure, the material of the flexible substrate 11 on which is formed the inductor 14L having the three-dimensional conical structure is hollowed out, and a material 31, such as a magnetic material, having different physical property values from those of the flexible substrate 11, is inserted into a hollowed portion 3 and is fixed thereto. For example, when ferrite is inserted as the material 31, it is possible to increase the value of inductance of the inductor 14L.

Figure 9:
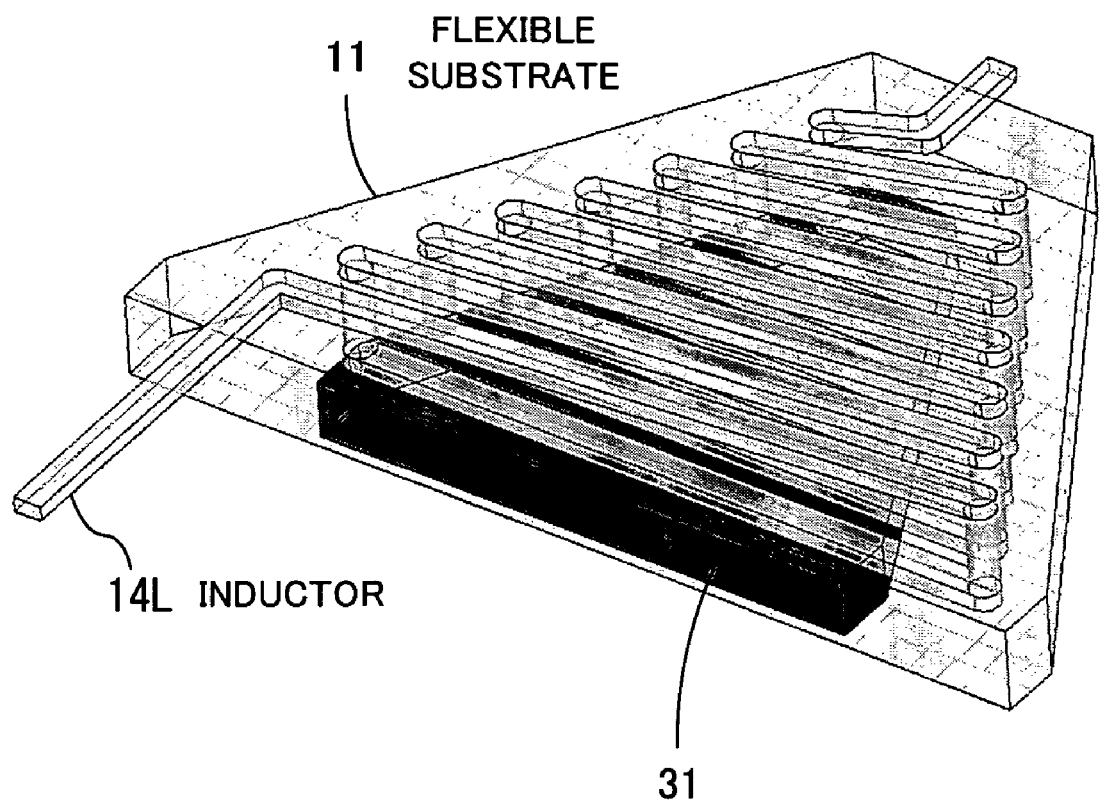
FIG. 9 is a diagram illustrating features of a structure of another variation of the inductor circuit board.

FIG. 9 is a diagram showing features of the structure of another variation of the inductor circuit board 10. Although the FIG. 9 inductor circuit board 10 and the FIG. 8 inductor circuit board 10 have the same shape, and provide the same advantageous effects, they are made by different methods. In the method of forming the inductor using board 10 shown in FIG. 9, the material 31 having different physical property values from those of the flexible substrate 11 is embedded in advance in the flexible substrate 11, and the inductor 14L having the three-dimensional conical structure is formed on a portion having the material 31 embedded therein.

Figure 10:
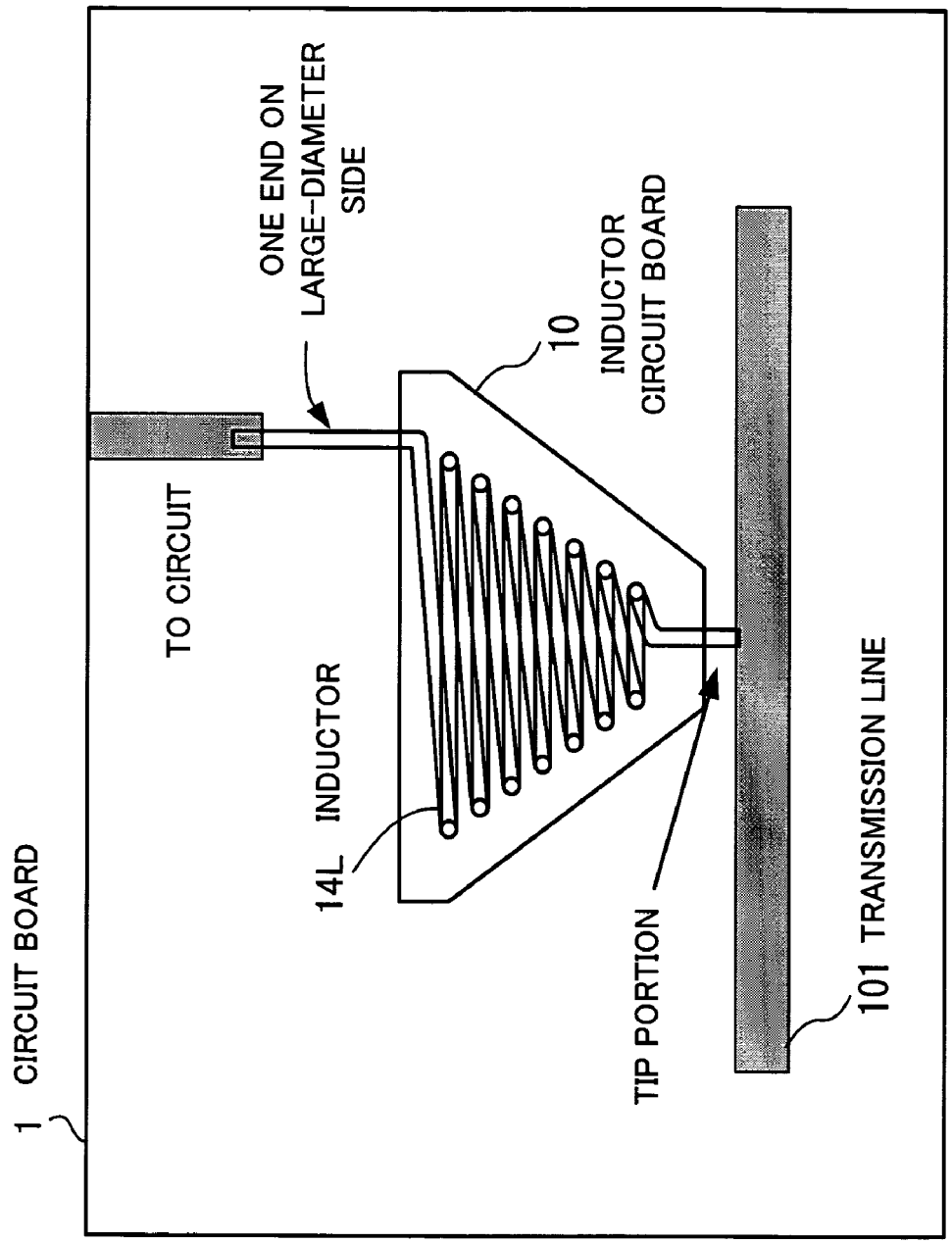
FIG. 10 is a diagram illustrating a circuit connection state of the inductor circuit board.

FIG. 10 is a diagram illustrating a circuit connection state of the inductor circuit board 10. The inductor circuit board 10 is mounted on a circuit board 1. The tip portion of the inductor 14L (transmission line pattern portion 14) is electrically connected to a transmission line 101 of the circuit board (another circuit board) 1. A large-diameter side end of the inductor 14L is connected to a circuit of the circuit board 1.

Figure 11:
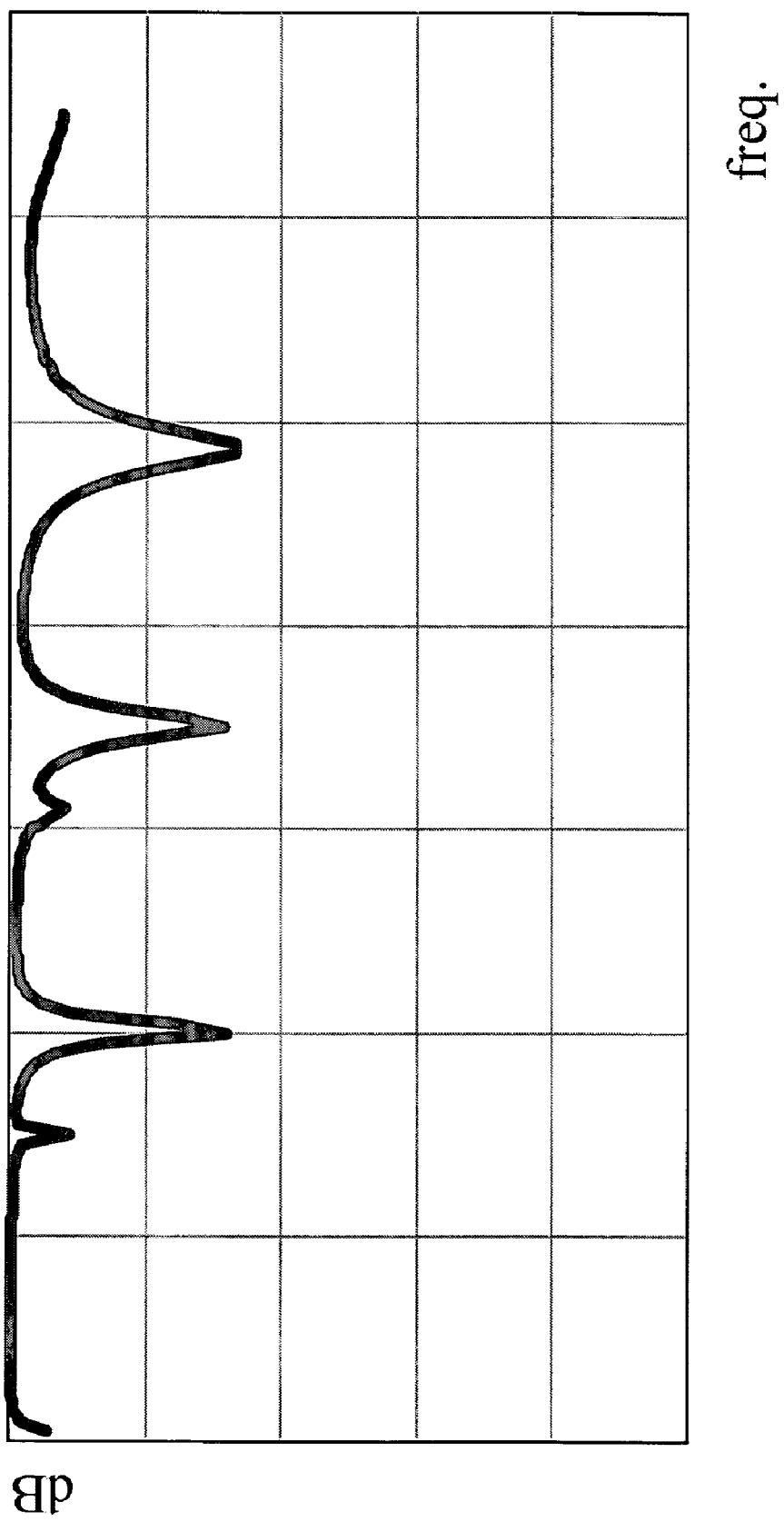
FIG. 11 is a diagram showing characteristics of an inductor circuit board exhibited when a planar coil is connected to a transmission line.

Next, a description will be given of results of a simulation of the inductor circuit board 10. FIG. 11 is a diagram showing characteristics of a planar coil connected to the transmission line. In FIG. 11, the vertical axis represents dB, and the horizontal axis represents the frequency. The frequency characteristics were evaluated in terms of S21 (forward transmission), which is an S-parameter of a transmission line in the case where an ordinary coil is connected thereto. It is understood from FIG. 11 that the frequency characteristics are degraded (dips are generated).

Figure 12:
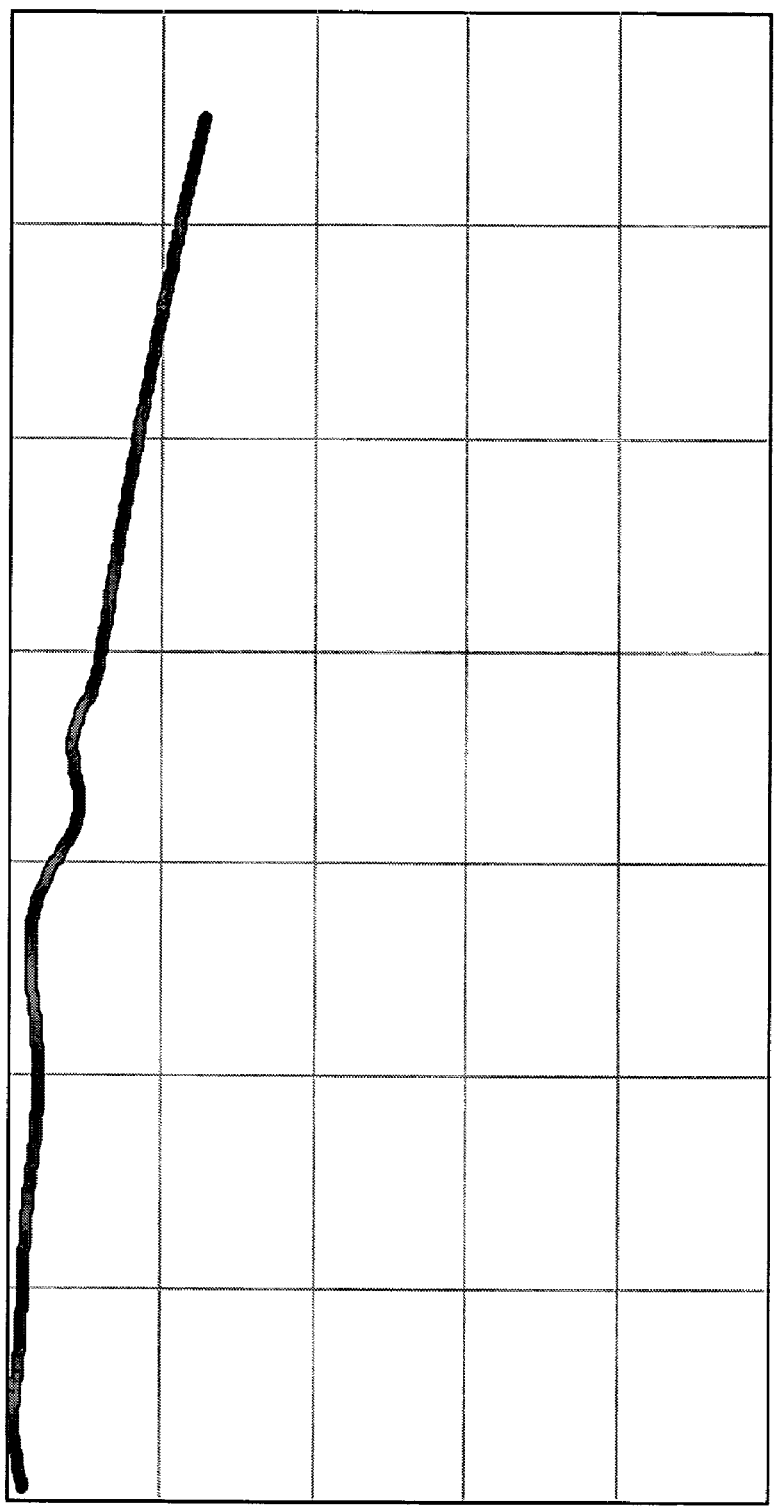
FIG. 12 is a diagram showing characteristics of the inductor circuit board.

FIG. 12 is a diagram showing characteristics of the inductor circuit board 10. In FIG. 12, the vertical axis represents dB, and the horizontal axis represents the frequency. The frequency characteristics were evaluated in terms of S21 of the transmission line in the case where the inductor 14L shown in FIG. 1 is connected. It is understood from FIG. 12 that no significant degradation of the frequency characteristics occurs in a frequency band in use (no dips are generated) but the frequency characteristics are enhanced.

As described hereinabove, according to the inductor circuit board 10, the component inductors are wired on the layer surfaces of the flexible substrate 11 using the transmission line pattern 14 and vias 13 to thereby form the inductor 14L having a three-dimensional conical coil structure in which the component inductors having different inductances are continuously connected. This makes it possible to form a broadband inductor having a reduced parasitic capacitance, thereby making it possible to enhance the frequency characteristics of the inductor. Further, since the inductor is formed by normal pattern wiring on the layer surfaces of the circuit board, it is easier to mount and handle the inductor than the conventional conical coil having an unstable shape.

Figure 13:
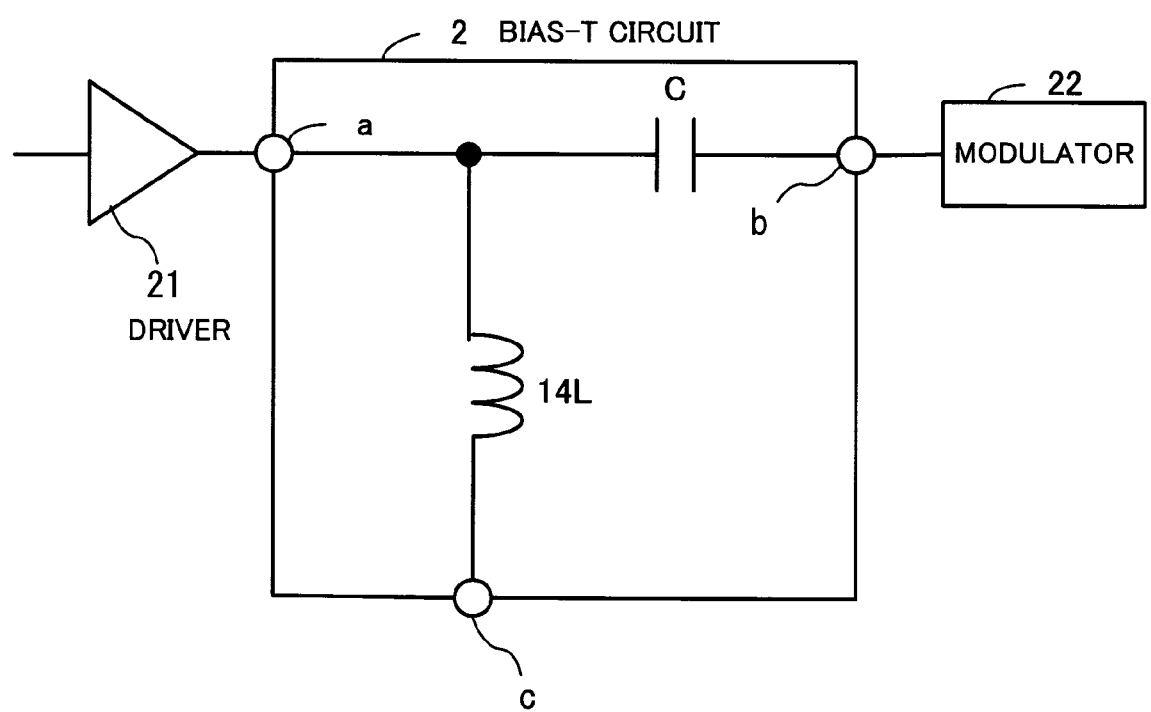
FIG. 13 is a diagram of a bias-T circuit.

Next, a description will be given of a bias-T circuit. FIG. 13 is a diagram showing the arrangement of the bias-T circuit. The bias-T circuit 2 is comprised of a capacitor C and the inductor 14L described above with reference to FIG. 1, and is constructed by connecting the capacitor C between terminals "a" and "b", and connecting the inductor 14L between the terminal "a" and a terminal "c" (a line between the terminals "a" and "b" corresponds to the transmission line 12 in FIG. 1).

In other words, the terminal "a" is connected to one end of the capacitor C and one end of the inductor 14L, and the other end of the capacitor C is connected to the terminal "b", while the other end of the inductor 14L is connected to the terminal "c".

In the bias-T circuit 2, a high-frequency signal delivered from a driver 21 is passed between the terminals "a" and "b" for eliminating low-frequency components thereof by the capacitor C. Further, a DC component inputted from the terminal "c" has high-frequency components removed by the inductor 14L, and is superposed on the high-frequency signal. The resulting high-frequency signal is delivered to a modulator 22.

Figure 14A:
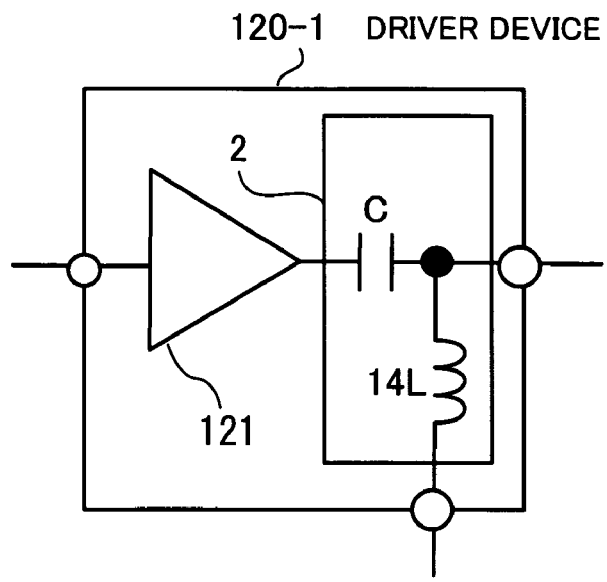
FIGS. 14A and 14B are diagrams showing examples of devices incorporating the bias-T circuit.
Figure 14B:
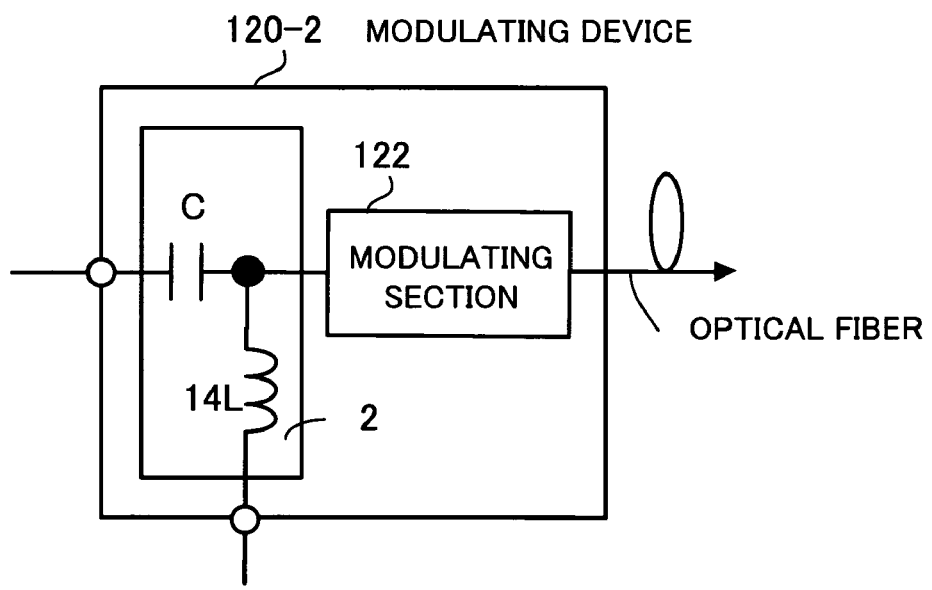
Figure 15:
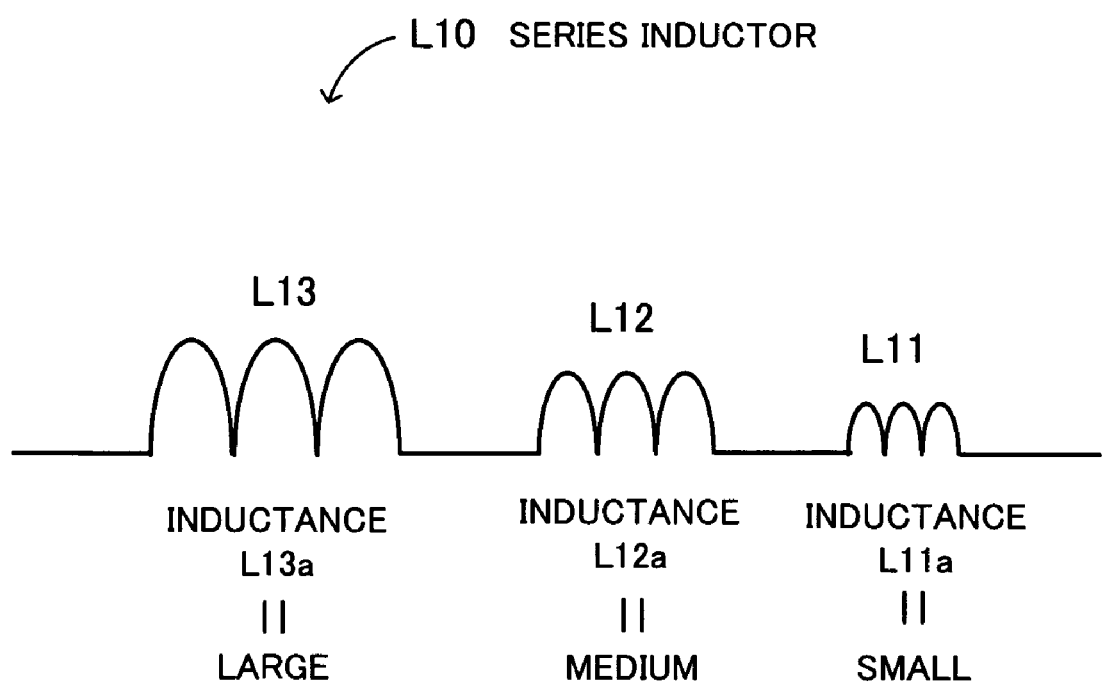
FIG. 15 is a diagram showing a series inductor.
Figure 16:
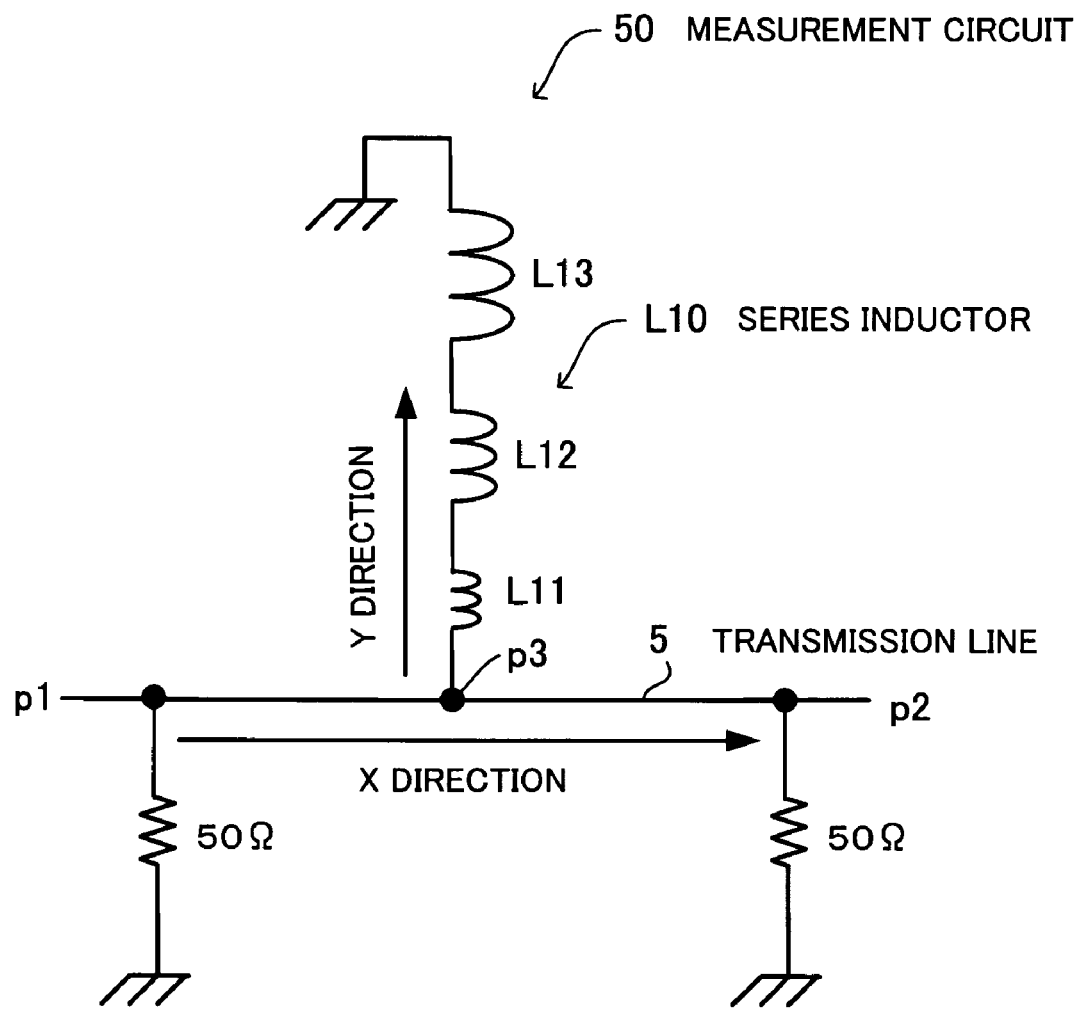
FIG. 16 is a diagram showing a circuit configuration in which the series inductor is connected to a transmission line.
Figure 17:
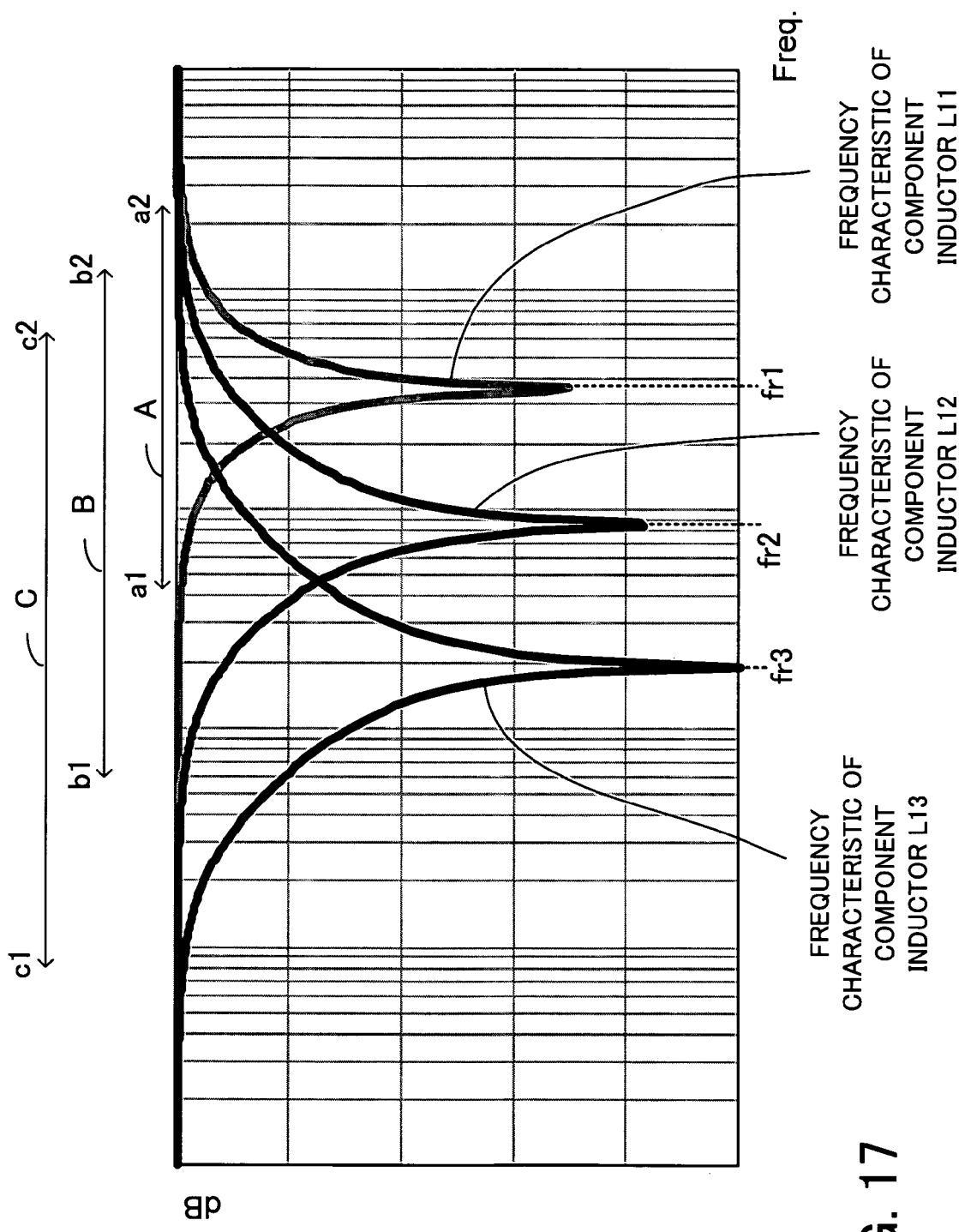
FIG. 17 is a diagram showing frequency characteristics of component inductors.
Figure 18:
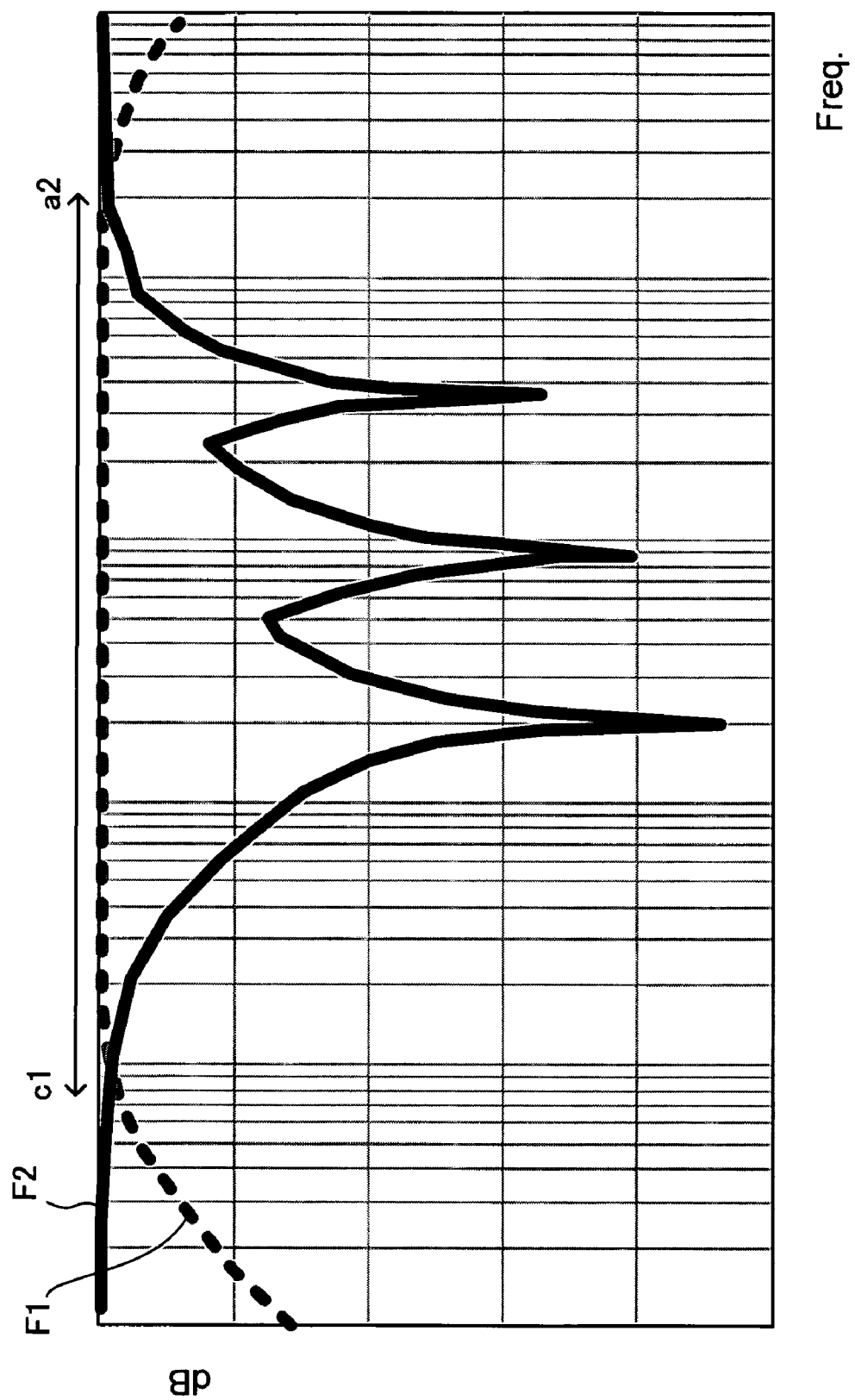
FIG. 18 is a diagram showing ideal frequency characteristics of a measurement circuit.
Figure 19:
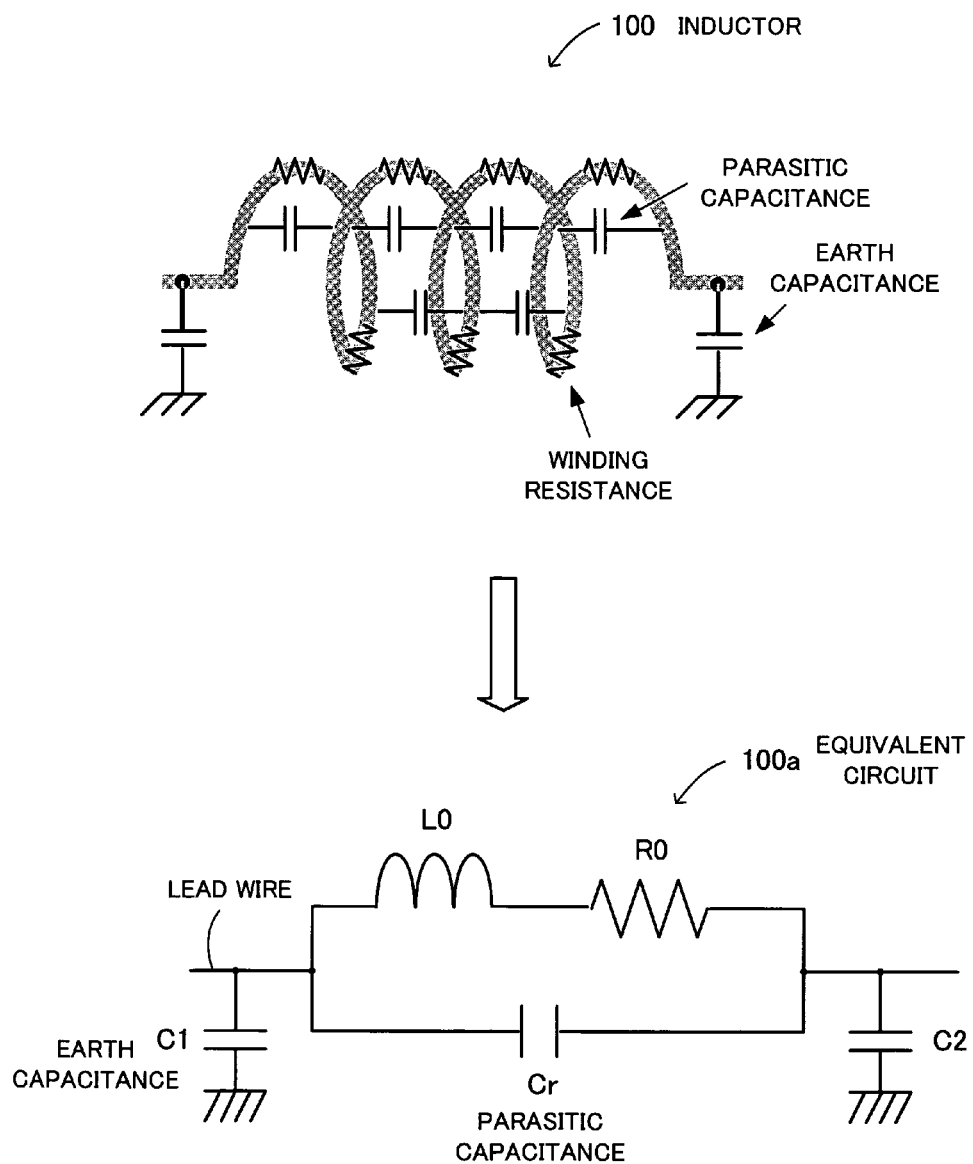
FIG. 19 is a diagram showing an equivalent circuit of an inductor.
Figure 20:
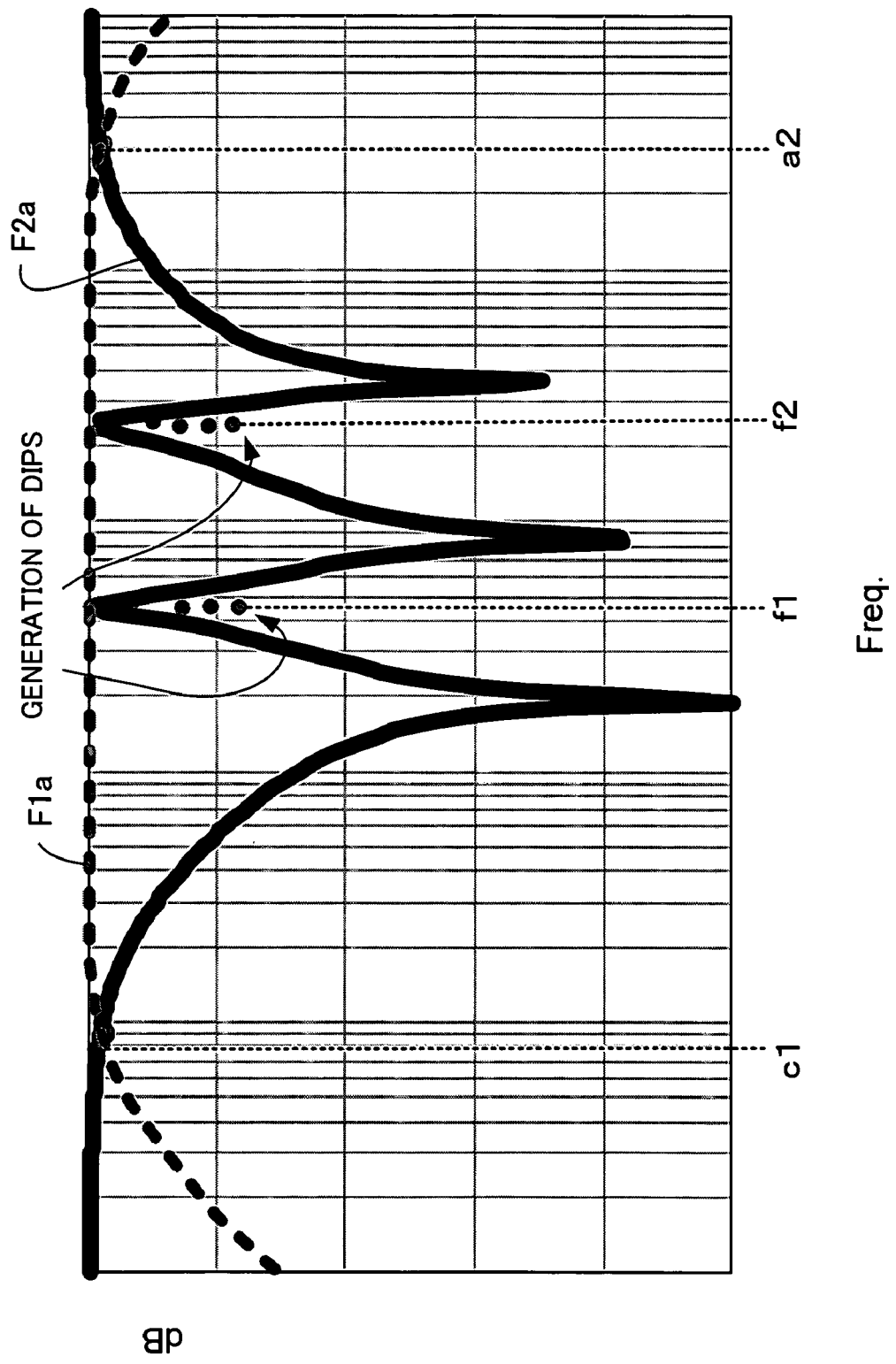
FIG. 20 is a diagram showing actual frequency characteristics of the measurement circuit.
Figure 21:
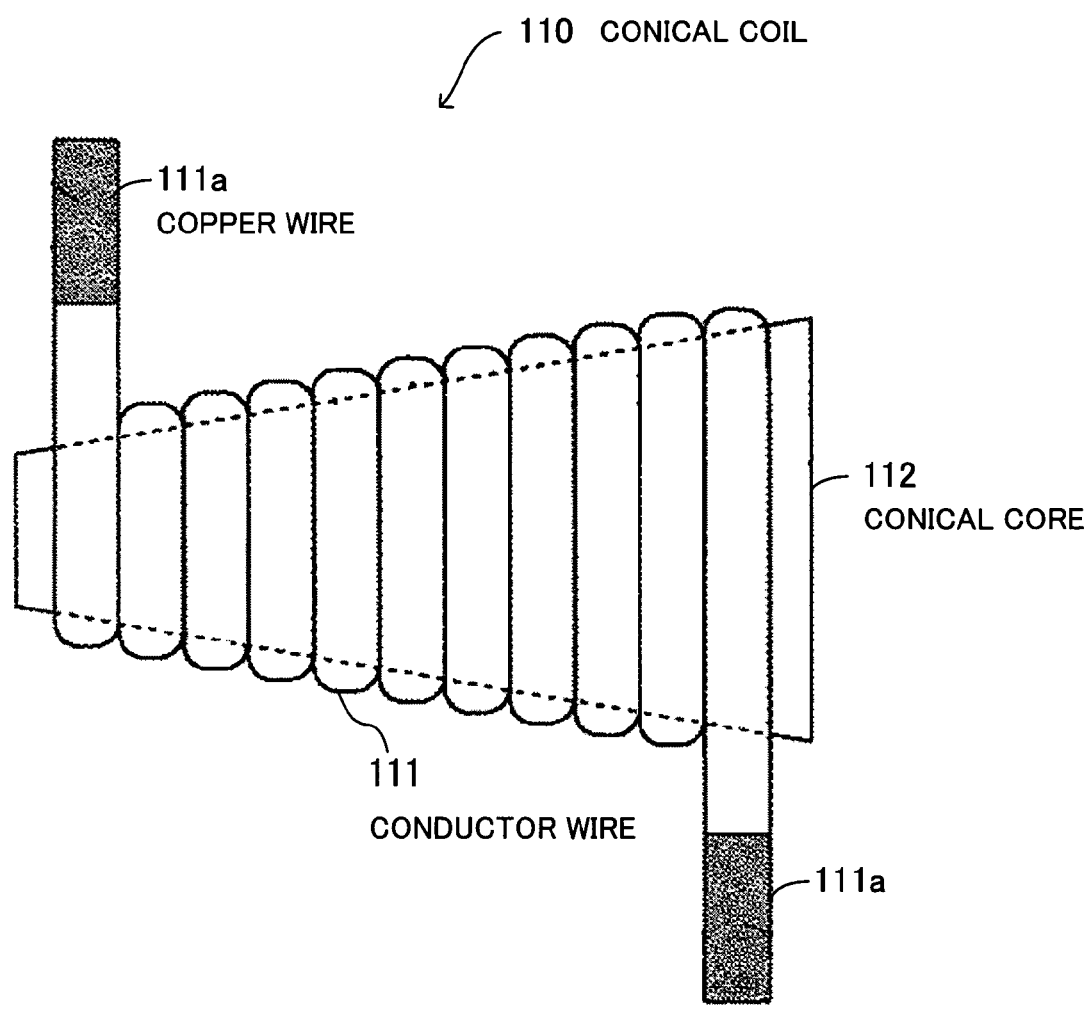
FIG. 21 is a diagram showing the outline of a conical coil.
Figure 22:
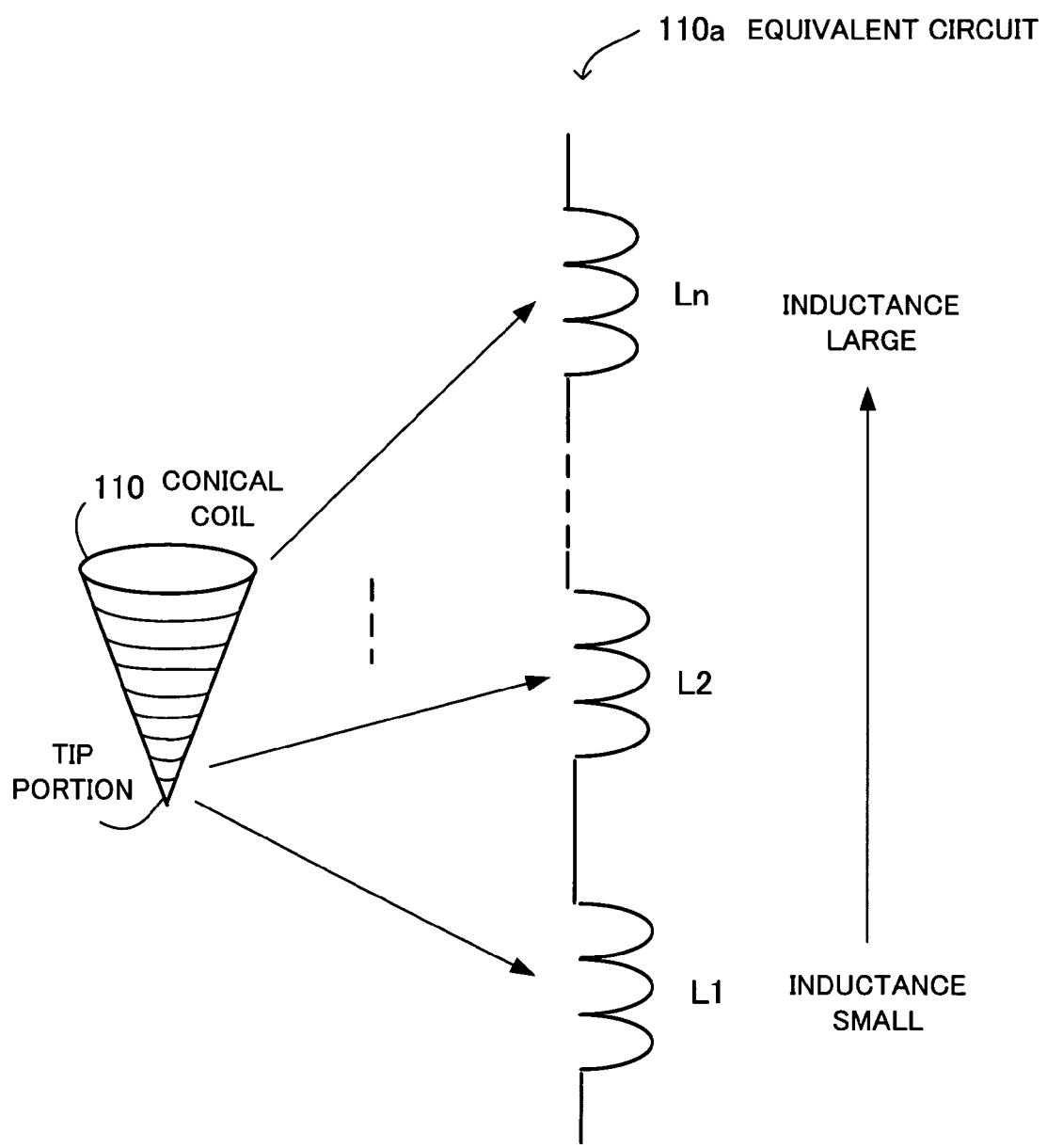
FIG. 22 is a diagram showing an equivalent circuit of the conical coil.
Figure 23:
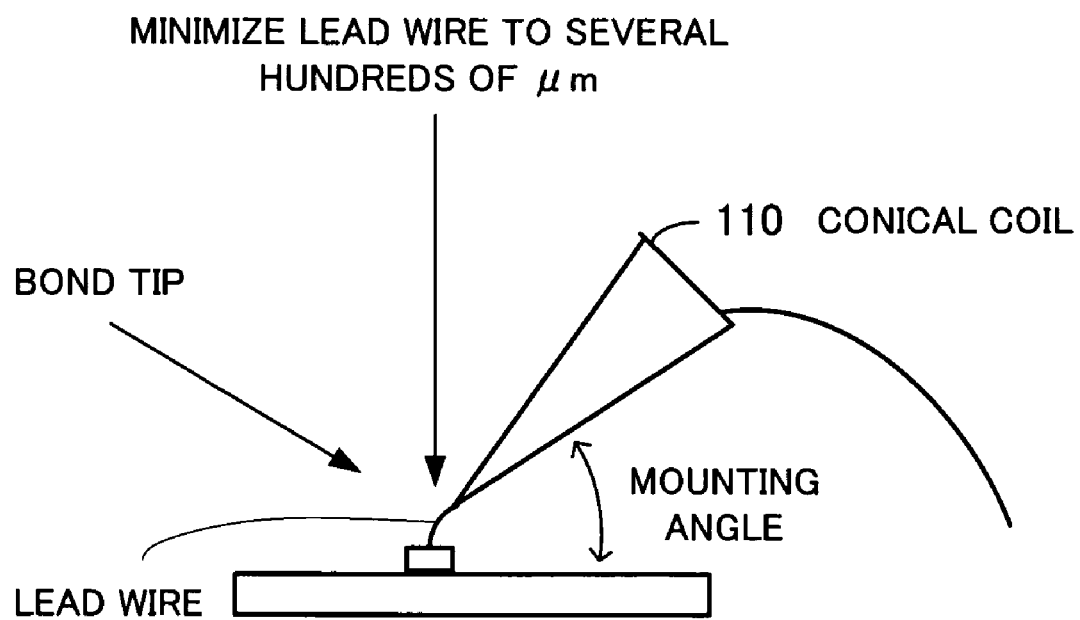
FIG. 23 is a diagram showing how the conical coil is bonded.

FIGS. 14A and 14B are diagrams showing examples of devices incorporating the bias-T circuit 2. As the examples of the devices incorporating the bias-T circuit 2, FIG. 14A shows a driver device 120-1, and FIG. 14B shows a modulating device 120-2. The driver device 120-1 includes a driver 121 and the bias-T circuit 2. An output end of the driver 121 and one end of the capacitor C are connected, and the bias-T circuit 2 is used as a level converter for converting the level of an output signal from the driver 121.

The modulating device 120-2 includes the bias-T circuit 2 and a modulating section 122. An input end of the modulating section 122 is connected to one end of the capacitor C and one end of the inductor 14L, and the bias-T circuit 2 is used for adjusting the bias of an input signal to the modulating section 122. It should be noted that an optical signal optically modulated by the modulating section 122 is output via an optical fiber.

As described hereinabove, since the bias-T circuit 2 uses the inductor 14L described above with reference to FIG. 1, the parasitic capacitance is reduced to make the inductor compatible with broadband, thereby making it possible to use the bias-T circuit 2 e.g. for high-speed communication systems whose transmission rate is in the order of 40 Gb/s, without degrading the frequency characteristics thereof. Further, compared with the case in which the conventional conical coil or the like is used, the bias-T circuit 2 using the inductor 14L is enhanced in the ease of manufacturing and can also be handled more easily.

According to the inductor circuit board, an inductor having a three-dimensional conical structure is formed by connecting one end of the inductor to a transmission line, and performing wiring according to the transmission line pattern on a plurality of layer surfaces of a substrate while connecting portions wired on the layer surfaces by vias that connect between the layer surfaces of the substrate, such that the inductor is expanded in a fan-like manner as it extends farther from the one end thereof connected to the transmission line. This makes it possible to form a broadband inductor having a reduced parasitic capacitance, thereby making it possible to enhance the frequency characteristics thereof. Further, since the inductor is formed by normal pattern wiring on the layer surfaces of the substrate, it is easier to mount and handle the inductor than the conventional conical coil having an unstable shape.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An inductor circuit board comprising:
a substrate;
a transmission line that is formed on said substrate; and
an inductor having a three-dimensional conical structure, said inductor having one end thereof connected to said transmission line and being formed according to a transmission line pattern by wiring on a plurality of layer surfaces of said substrate and connecting portions wired on the respective layer surfaces by vias that connect between the layer surfaces of said substrate, such that said inductor is expanded in a fan-like manner as said inductor extends farther from said one end connected to said transmission line.

2. The inductor circuit board according to claim 1, wherein said substrate is a flexible substrate.

3. The inductor circuit board according to claim 1, wherein a ground surface of a portion of said substrate on a side reverse to a mounting surface of said substrate where said inductor is mounted is removed.

4. The inductor circuit board according to claim 1, wherein a ground surface of a portion of said substrate on a side reverse to a tip portion of said inductor is removed, said tip portion being connected to said transmission line.

5. The inductor circuit board according to claim 1, wherein a material of a portion of said substrate surrounding said inductor is removed to provide spaces in the surrounding portion.

6. The inductor circuit board according to claim 1, wherein said substrate is a two-layer substrate, and wherein assuming that wiring is performed according to the transmission line pattern on the layers in an alternating manner, starting from a first layer surface, if portions wired on the respective layers are represented by Pn, respectively, and vias connected to opposite ends of each portion Pn are represented by V(n−1) and Vn, respectively, in a case of n=1, a wired portion P1 is formed on the first layer surface such that the wired portion P1 has one end thereof connected to said transmission line and the other end thereof connected to a via V1 whereby said wired portion P1 is connected to a wired portion P2 on a second layer by the via V1, in a case of n=2k (k=1, 2, . . . ), a wired portion P2k is formed on a second layer such that the wired portion P2k has opposite ends thereof connected to a via V(2k−1) and a via V2k, respectively, whereby the wired portion P2k is connected to a wired portion P(2k−1) on the first layer surface by the via V(2k−1) and is connected to a wired portion P(2k+1) on the first layer surface by the via V2k, in a case of n=(2k−1) (k=2, 3, . . . ), a wired portion P(2k−1) is formed on the first layer surface such that the wired portion P(2k−1) has opposite ends thereof connected to a via V(2k−2) and a via V(2k−1), respectively, whereby the wired portion P(2k−1) is connected to a wired portion P(2k−2) on the second layer surface by the via V(2k−2) and is connected to a wired portion P2k on the second layer surface by the via V(2k−1), and when one end of the wired portion P(2k−1) is connected to a signal source in the case of n=(2k−1) (k=2, 3, . . . ), the wired portion P(2k−1) is formed on the first layer surface such that the wired portion P(2k−1) has the one end thereof connected to the signal source and the other end thereof connected to the via V(2k−2) whereby the wired portion P(2k−1) is connected to the wired portion P(2k−2) on the second layer surface by the via V(2k−2).

7. The inductor circuit board according to claim 1, wherein said substrate is a four-layer substrate, and wherein assuming that wiring is performed according to the transmission line pattern on the layers in an alternating manner, starting from a first layer surface, if portions wired on the respective layers are represented by Pn, respectively, and vias connected to opposite ends of each portion Pn are represented by V(n−1) and Vn, respectively, in a case of n=1, a wired portion P1 is formed on the first layer surface such that the wired portion P1 has one end thereof connected to said transmission line and the other end thereof connected to a via V1 whereby the wired portion P1 is connected to a wired portion P2 on a second layer by the via V1, in a case of n=6k (k=1, 2, . . . ), a wired portion P6k is formed on the second layer such that the wired portion P6k has opposite ends thereof connected to a via V(6k−1) and a via V6k, respectively, whereby the wired portion P6k is connected to a wired portion P(6k−1) on a third layer by the via V(6k−1) and is connected to a wired portion P(6k−1) on the first layer surface by the via V6k, in a case of n=6k−1 (k=1, 2, . . . ), the wired portion P(6k−1) is formed on the third layer surface such that the wired portion P(6k−1) has opposite ends thereof connected to a via V(6k−2) and the via V(6k−1), respectively, whereby the wired portion P(6k−1) is connected to a wired portion P(6k−2) on a fourth layer by the via V(6k−2) and is connected to the wired portion P6k on the second layer surface by the via V(6k−1), in a case of n=6k−2 (k=1, 2, . . . ), the wired portion P(6k−2) is formed on the fourth layer surface such that the wired portion P(6k−2) has opposite ends thereof connected to a via V(6k−3) and the via V(6k−2), respectively, whereby the wired portion P(6k−2) is connected to a wired portion P(6k−3) on the third layer surface by the via V(6k−3) and is connected to the wired portion P(6k−1) on the third layer surface by the via V(6k−2), in a case of n=6k−3 (k=1, 2, . . . ), the wired portion P(6k−3) is formed on the third layer surface such that the wired portion P(6k−3) has opposite ends thereof connected to a via V(6k−4) and the via V(6k−3), respectively, whereby the wired portion P(6k−3) is connected to a wired portion P(6k−4) on the second layer surface by the via V(6k−4) and is connected to the wired portion P(6k−2) on the fourth layer surface by the via V(6k−3), in a case of n=6k−4 (k=1, 2, . . . ), the wired portion P(6k−4) is formed on the second layer surface such the wired portion P(6k−4) has opposite ends thereof connected to a via V(6k−5) and the via V(6k−4), respectively, whereby the wired portion P(6k−4) is connected to a wired portion P(6k−5) on the first layer surface by the via V(6k−5) and is connected to the wired portion P(6k−3) on the third layer surface by the via V(6k−4), in a case of n=6k−5 (k=2, 3, . . . ), the wired portion P(6k−5) is formed on the first layer surface such that the wired portion P(6k−5) has opposite ends thereof connected to a via V(6k−6) and the via V(6k−5), respectively, whereby the wired portion P(6k−5) is connected to a wired portion P(6k−6) on the second layer surface by the via V(6k−6) and is connected to the wired portion P(6k−4) on the second layer surface by the via V(6k−5), and when one end of the wired portion P(6k−5) is connected to a signal source in the case of n=6k−5 (k=2, 3, . . . ), the wired portion P(6k−5) is formed on the first layer surface such that the wired portion P(6k−5) has the one end thereof connected to the signal source and the other end thereof connected to the via V(6k−6), whereby the wired portion P(6k−5) is connected to the wired portion P(6k−6) on the second layer surface by the via V(6k−6).

8. The inductor circuit board according to claim 1, characterized by a structure in which a portion of said substrate is removed, said portion being surrounded by said inductor, and a material having different physical property values from those of said substrate is inserted in the removed portion.

9. The inductor circuit board according to claim 1, wherein a tip portion of said inductor is electrically connected to a transmission line of another circuit board, a large diameter-side end of said inductor is connected to a circuit of the other circuit board.

10. A method of forming an inductor on a substrate, comprising the steps of:

connecting one end of the inductor to a transmission line on the substrate; and forming the inductor having a three-dimensional conical structure according to a transmission line pattern by wiring on a plurality of layer surfaces of the substrate and connecting portions wired on the respective layer surfaces by vias that connect between the layer surfaces of the substrate, such that the inductor is expanded in a fan-like manner as the inductor extends farther from the one end connected to the transmission line.

11. The method according to claim 10, wherein the substrate is a flexible substrate, and wherein the inductor having the three-dimensional conical structure is formed on the flexible substrate.

12. The method according to claim 10, wherein the inductor having the three-dimensional conical structure is formed on the substrate in which a material having different physical property values from those of the substrate is embedded in advance.

13. A bias-T circuit that supplies a high-frequency signal while superposing a DC component thereon, comprising:

a transmission line that is formed on a substrate, for passing the high-frequency signal therethrough;

an inductor that removes high-frequency components of the DC component, said inductor having one end thereof connected to a portion of said transmission line between an input end and an output end thereof, and having a three-dimensional conical structure formed by wiring on a plurality of layer surfaces of said substrate and connecting portions wired on the layer surfaces by vias that connect between the layer surfaces of the substrate, such that said inductor is expanded in a fan-like manner as said inductor extends from said one end connected to said transmission line; and a capacitor that is connected to said transmission line, for removing low-frequency components of the high-frequency signal by causing the high-frequency signal to pass therethrough.

14. The bias-T circuit according to claim 13, incorporated in a driver device or a modulating device.

* * * * *

UNITED STATES PATENT AND TRADEMARK OFFICE
CERTIFICATE OF CORRECTION

PATENT NO. : 7,446,633 B2  Page 1 of 1
APPLICATION NO. : 11/654017
DATED : November 4, 2008
INVENTOR(S) : Takatoshi Yagisawa It is certified that error appears in the above-identified patent and that said Letters Patent is hereby corrected as shown below:

TITLE PAGE, ITEM (57) - ABSTRACT

Line 17, change "indictor" to --inductor--;

IN THE CLAIMS

Claim 7, Col. 15, line 66, change "wired portion P(6k-1) on the first layer surface by the" to --wired portion P(6k+1) on the first layer surface by the--

Signed and Sealed this

Twentieth Day of January, 2009

JON W. DUDAS
*Director of the United States Patent and Trademark Office*